(12) United States Patent
Yukawa

(10) Patent No.: US 7,700,984 B2
(45) Date of Patent: Apr. 20, 2010

(54) SEMICONDUCTOR DEVICE INCLUDING MEMORY CELL

(75) Inventor: Mikio Yukawa, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 11/414,497

(22) Filed: May 1, 2006

(65) Prior Publication Data

US 2006/0261331 A1   Nov. 23, 2006

(30) Foreign Application Priority Data

May 20, 2005   (JP) .............................. 2005-148821

(51) Int. Cl.
| H01L 27/108 | (2006.01) |
| H01L 29/76 | (2006.01) |
| H01L 29/94 | (2006.01) |
| H01L 31/119 | (2006.01) |
| H01L 29/00 | (2006.01) |
| H01L 29/04 | (2006.01) |
| H01L 29/12 | (2006.01) |
| H01L 31/036 | (2006.01) |
| H01L 31/112 | (2006.01) |
| H01L 29/786 | (2006.01) |
| H01L 29/80 | (2006.01) |

(52) U.S. Cl. ............................ 257/296; 257/68; 257/71; 257/277; 257/297; 257/298; 257/299; 257/300; 257/301; 257/302; 257/303; 257/304; 257/305; 257/306; 257/307; 257/308; 257/309; 257/310; 257/311; 257/312; 257/313; 257/532; 257/535; 257/906; 257/908; 257/E29.17; 257/E29.322

(58) Field of Classification Search .................. 257/68, 257/71, 277, 296–313, 532, 535, 906, 908, 257/E29.17, E29.322

See application file for complete search history.

(56) References Cited

U.S. PATENT DOCUMENTS

| 3,585,467 | A | * | 6/1971 | Linzey et al. ................ 361/314 |
| 3,833,894 | A |   | 9/1974 | Aviram et al. |
| 4,224,635 | A | * | 9/1980 | Mauthe ....................... 257/298 |
| 4,897,700 | A | * | 1/1990 | Nakamura ................... 257/298 |
| 4,959,748 | A | * | 9/1990 | Kimura et al. .............. 361/323 |

(Continued)

FOREIGN PATENT DOCUMENTS

EP   1341186   9/2003

(Continued)

*Primary Examiner*—Ida M Soward
(74) *Attorney, Agent, or Firm*—Eric J. Robinson; Robinson Intellectual Property Law Office, P.C.

(57) ABSTRACT

It is an object of the present invention to provide a semiconductor device capable of additionally recording data at a time other than during manufacturing and preventing forgery due to rewriting and the like. Moreover, another object of the present invention is to provide an inexpensive, nonvolatile, and highly-reliable semiconductor device. A semiconductor device includes a first conductive layer, a second conductive layer, and an organic compound layer between the first conductive layer and the second conductive layer, wherein the organic compound layer can have the first conductive layer and the second conductive layer come into contact with each other when Coulomb force generated by applying potential to one or both of the first conductive layer and the second conductive layer is at or over a certain level.

30 Claims, 15 Drawing Sheets

U.S. PATENT DOCUMENTS

| | | | |
|---|---|---|---|
| 5,063,425 A * | 11/1991 | Yamauchi et al. | 257/298 |
| 5,111,259 A * | 5/1992 | Teng et al. | 257/301 |
| 5,119,154 A * | 6/1992 | Gnadinger | 257/295 |
| 5,206,665 A | 4/1993 | Kawade et al. | |
| 5,375,250 A | 12/1994 | Van den Heuvel | |
| 5,389,475 A | 2/1995 | Yanagisawa et al. | |
| 5,625,219 A | 4/1997 | Takagi | |
| 5,745,336 A * | 4/1998 | Saito et al. | 361/321.5 |
| 5,780,919 A | 7/1998 | Chua et al. | |
| 5,883,397 A | 3/1999 | Isoda et al. | |
| 5,917,211 A * | 6/1999 | Murata et al. | 257/296 |
| 6,034,882 A | 3/2000 | Johnson et al. | |
| 6,136,643 A * | 10/2000 | Jeng et al. | 438/253 |
| 6,184,550 B1 * | 2/2001 | Van Buskirk et al. | 257/306 |
| 6,190,957 B1 * | 2/2001 | Mochizuki et al. | 438/240 |
| 6,288,437 B1 | 9/2001 | Forbes et al. | |
| 6,340,588 B1 | 1/2002 | Nova et al. | |
| 6,392,953 B2 | 5/2002 | Yamada et al. | 365/230.03 |
| 6,465,282 B1 | 10/2002 | Tobben et al. | |
| 6,468,848 B1 * | 10/2002 | Awaka et al. | 438/199 |
| 6,486,530 B1 * | 11/2002 | Sasagawa et al. | 257/532 |
| 6,528,815 B1 | 3/2003 | Brown et al. | |
| 6,683,322 B2 | 1/2004 | Jackson et al. | |
| 6,683,802 B2 | 1/2004 | Katoh | |
| 6,717,181 B2 * | 4/2004 | Murakami et al. | 257/72 |
| 6,723,396 B1 | 4/2004 | Patrick | |
| 6,734,463 B2 * | 5/2004 | Ishikawa | 257/79 |
| 6,750,530 B1 | 6/2004 | Klaasen et al. | |
| 6,809,952 B2 | 10/2004 | Masui | |
| 6,828,685 B2 | 12/2004 | Stasiak | |
| 6,844,609 B2 | 1/2005 | Motsiff et al. | |
| 6,847,047 B2 | 1/2005 | VanBuskirk et al. | |
| 6,858,270 B2 | 2/2005 | Patrick | |
| 6,905,907 B2 * | 6/2005 | Konuma | 438/99 |
| 6,947,321 B2 | 9/2005 | Tanabe | |
| 6,950,331 B2 | 9/2005 | Yang et al. | |
| 6,962,844 B2 | 11/2005 | Stasiak | |
| 6,977,389 B2 | 12/2005 | Tripsas et al. | |
| 6,979,880 B2 | 12/2005 | Bhattacharyya et al. | |
| 7,034,380 B2 | 4/2006 | Andideh | |
| 7,050,326 B2 | 5/2006 | Anthony | |
| 7,091,750 B2 * | 8/2006 | Shionoiri et al. | 327/51 |
| 7,177,191 B2 * | 2/2007 | Fasoli et al. | 365/185.17 |
| 7,179,508 B2 * | 2/2007 | Hanley et al. | 427/525 |
| 7,200,050 B2 | 4/2007 | Kato | |
| 7,220,985 B2 | 5/2007 | Cheung et al. | |
| 7,359,230 B2 | 4/2008 | Sumida et al. | |
| 2002/0196657 A1 | 12/2002 | Katoh | |
| 2003/0089943 A1 * | 5/2003 | Duncombe et al. | 257/310 |
| 2003/0155602 A1 | 8/2003 | Krieger et al. | |
| 2003/0156449 A1 | 8/2003 | Ooishi | |
| 2003/0183699 A1 | 10/2003 | Masui | |
| 2003/0230746 A1 | 12/2003 | Stasiak | |
| 2004/0026690 A1 | 2/2004 | Bernds et al. | |
| 2004/0027849 A1 | 2/2004 | Yang et al. | |
| 2004/0057323 A1 | 3/2004 | Tanabe | |
| 2004/0100007 A1 * | 5/2004 | Engwall et al. | 267/140.13 |
| 2004/0164302 A1 | 8/2004 | Arai et al. | |
| 2004/0217441 A1 | 11/2004 | Lehmann et al. | |
| 2004/0238864 A1 | 12/2004 | Tripsas et al. | |
| 2005/0006640 A1 | 1/2005 | Jackson et al. | |
| 2005/0023632 A1 * | 2/2005 | Shapira et al. | 257/499 |
| 2005/0073883 A1 | 4/2005 | Anthony | |
| 2005/0174875 A1 | 8/2005 | Katoh | |
| 2005/0179374 A1 * | 8/2005 | Kwak | 313/506 |
| 2005/0195554 A1 * | 9/2005 | Borland et al. | 361/303 |
| 2005/0259068 A1 * | 11/2005 | Nihei et al. | 345/107 |
| 2006/0097250 A1 | 5/2006 | Koyama et al. | |
| 2006/0102919 A1 | 5/2006 | Watanabe et al. | |
| 2006/0146394 A1 * | 7/2006 | Kaga et al. | 359/296 |
| 2006/0154432 A1 * | 7/2006 | Arai et al. | 438/385 |
| 2006/0157772 A1 | 7/2006 | Sumida et al. | |
| 2006/0175648 A1 | 8/2006 | Asami | |
| 2006/0214008 A1 | 9/2006 | Asami et al. | |
| 2006/0220252 A1 | 10/2006 | Yukawa et al. | |
| 2006/0246269 A1 | 11/2006 | Yukawa | |
| 2006/0246643 A1 | 11/2006 | Ohsawa | |
| 2006/0263634 A1 | 11/2006 | Yamazaki | |
| 2006/0267068 A1 | 11/2006 | Sato et al. | |
| 2007/0153565 A1 | 7/2007 | Nomura et al. | |
| 2007/0194301 A1 | 8/2007 | Sezi et al. | |
| 2007/0215869 A1 | 9/2007 | Moriya et al. | |
| 2007/0230235 A1 | 10/2007 | Abe et al. | |
| 2008/0048180 A1 | 2/2008 | Abe et al. | |

FOREIGN PATENT DOCUMENTS

| | | |
|---|---|---|
| EP | 1 381 054 | 1/2004 |
| EP | 1453088 | 9/2004 |
| JP | 07-022669 | 1/1995 |
| JP | 2001-345431 | 12/2001 |
| JP | 2004-047791 | 2/2004 |
| WO | WO-2002/037500 | 5/2002 |
| WO | WO-2004/015778 | 2/2004 |
| WO | WO-2005/096380 | 10/2005 |
| WO | WO-2006/043611 | 4/2006 |
| WO | WO-2006/043687 | 4/2006 |

* cited by examiner

SEMICONDUCTOR DEVICE INCLUDING MEMORY CELL

BACKGROUND OF THE INVENTION

1. Field of Invention

The present invention relates to a semiconductor device provided with a storage element.

2. Description of the Related Art

In recent years, development has been advanced on a semiconductor device having various functions in which a plurality of circuits are integrated over an insulating surface. Further, development has been advanced on a semiconductor device which can send and receive data wirelessly by providing an antenna. Such a semiconductor device is referred to as a wireless chip (also referred to as an ID tag, an IC tag, an IC chip, an RF (Radio Frequency) tag, a wireless tag, an electronic tag, or an RFID (Radio Frequency Identification) tag), and has already been introduced into some markets Many of semiconductor devices that are currently in practical use have circuits using semiconductor substrates such as Si (the circuits are also referred to as ICs (Integrated Circuits)) and antennas, and the IC chip includes a storage circuit (also called a memory), a controlling circuit, and the like. In particular, a more sophisticated and higher-value-added semiconductor device can be provided when a storage circuit capable of storing a large amount of data is provided. Moreover, it has been required to manufacture these semiconductor devices at low cost, and in recent years, development has been conducted extensively on an organic memory, an organic TFT, and the like which use an organic compound in a controlling circuit, a storage circuit, and the like (for example, see Reference 1: Japanese Patent Application Laid-Open No. 2004-47791).

The storage circuit is, for example, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, or the like. Among these, since a DRAM and an SRAM are volatile storage circuits in which data are erased by turning off the power, data need to be written every time the power is turned on. Meanwhile, an FeRAM is a nonvolatile storage circuit. However, since an FeRAM uses a capacitor element including a ferroelectric layer, the number of manufacturing steps increases. Although a mask ROM has a simple structure, data need to be written in the manufacturing step and data cannot be additionally recorded. An EPROM, an EEPROM, and a flash memory are nonvolatile storage circuits; however, the number of manufacturing steps increases because an element including two gate electrodes is used.

SUMMARY OF THE INVENTION

In view of the above problems, it is an object of the present invention to provide a semiconductor device having a nonvolatile storage element which is additionally recordable at a time other than during manufacturing and in which forgery by rewriting or the like can be prevented. Moreover, it is an object of the present invention to provide an inexpensive semiconductor device with high reliability.

A semiconductor device of the present invention has a storage element having a first conductive layer, a second conductive layer, and an organic compound layer provided between the first conductive layer and the second conductive layer, wherein a charge is generated in the first conductive layer and the second conductive layer by generating voltage difference at or over a certain level between the first conductive layer and the second conductive layer, and wherein at least parts of the first conductive layer and the second conductive layer are in contact with each other by Coulomb force of the charge. Moreover, the organic compound layer can have at least parts of the first conductive layer and the second conductive layer come into contact with each other by generating voltage difference at or over a certain level between the first conductive layer and the second conductive layer.

Further, a semiconductor device of the present invention has a storage element having a first conductive layer, a second conductive layer, and an organic compound layer provided between the first conductive layer and the second conductive layer, wherein reaction heat due to reaction or decomposition of an organic compound is generated by applying voltage at or over a certain voltage level to the first conductive layer and the second conductive layer, causing the organic compound layer to be deformed by the reaction heat, whereby at least parts of the first conductive layer and the second conductive layer come into contact with each other.

Moreover, the present invention includes the followings.

A semiconductor device according to one aspect of the present invention has a storage element having a first conductive layer, a second conductive layer, and an organic compound layer between the first conductive layer and the second conductive layer, wherein the organic compound layer can have the first conductive layer and the second conductive layer come in contact with each other when Coulomb force generated by applying potential to one or both of the first conductive layer and the second conductive layer is at or over a certain level.

A semiconductor device according to one aspect of the present invention has a memory cell array in which storage elements are arranged in matrix and a writing circuit, wherein each of the storage elements has a first conductive layer, a second conductive layer, and an organic compound layer between the first conductive layer and the second conductive layer, and wherein the organic compound layer can have the first conductive layer and the second conductive layer come into contact with each other when Coulomb force generated by applying potential to one or both of the first conductive layer and the second conductive layer is at or over a certain level.

A semiconductor device according to one aspect of the present invention has a memory cell array in which memory cells are arranged in matrix and a writing circuit, wherein each of the memory cells has a transistor and a storage element, wherein the storage element has a first conductive layer, a second conductive layer, and an organic compound layer between the first conductive layer and the second conductive layer, and wherein the organic compound layer can have the first conductive layer and the second conductive layer come into contact with each other when Coulomb force generated by applying potential to one or both of the first conductive layer and the second conductive layer is at or over a certain level.

A semiconductor device according to one aspect of the present invention has a storage element having a first conductive layer, a second conductive layer, and an organic compound layer between the first conductive layer and the second conductive layer, wherein the organic compound layer is deformed to have the first conductive layer and the second conductive layer come into contact with each other when reaction heat generated by applying potential to one or both of the first conductive layer and the second conductive layer is at or over a certain level.

A semiconductor device according to an aspect of the present invention has a memory cell array in which storage elements are arranged in matrix and a writing circuit, wherein each of the storage elements has a first conductive layer, a second conductive layer, and an organic compound layer between the first conductive layer and the second conductive layer, wherein the organic compound layer is deformed to have the first conductive layer and the second conductive layer come into contact with each other when reaction heat generated by applying potential to one or both of the first conductive layer and the second conductive layer is at or over a certain level.

A semiconductor device according to an aspect of the present invention has a memory cell array in which memory cells are arranged in matrix and a writing circuit, wherein each of the memory cells has a transistor and a storage element, wherein the storage element has a first conductive layer, a second conductive layer, and an organic compound layer between the first conductive layer and the second conductive layer, and wherein the organic compound layer is deformed to have the first conductive layer and the second conductive layer come into contact with each other when reaction heat generated by applying potential to one or both of the first conductive layer and the second conductive layer is at or over a certain level.

The above semiconductor device may include a conductive layer functioning as an antenna and a transistor to be connected to the conductive layer and, moreover, may include a diode to be connected to the first conductive layer or the second conductive layer.

In the above semiconductor device, the memory cell array and the writing circuit may be provided over a glass substrate or a flexible substrate, and the writing circuit may be formed by using a thin film transistor.

In the above semiconductor device, the memory cell array and the writing circuit may be provided over a single-crystal semiconductor substrate and the writing circuit may be formed by using a field effect transistor.

Furthermore, in the above semiconductor device, one or more of a power source circuit, a clock generating circuit, a data demodulating/modulating circuit, a controlling circuit, and an interface circuit may be provided in addition to the writing circuit.

By applying the present invention, it is possible to write (additionally record) data at a time other than during manufacturing a chip but impossible to rewrite the data. Therefore, a semiconductor device capable of preventing forgery due to rewriting can be obtained. Moreover, since a semiconductor device of the present invention has a storage element with a simple structure in which an organic compound layer is sandwiched between a pair of conductive layers, the semiconductor device can be inexpensive. Furthermore, since writing is carried out in a semiconductor device of the present invention by using an electric field generated in the storage element, it is possible to decrease a current value at the writing. In addition, by decreasing the area of the storage element, it is possible to decrease the current value to be fed to the storage element at the writing. Also, by decreasing the distance between the conductive layers in the storage element, writing voltage can be decreased. Thus, characteristics of the storage element can be improved. As a result, the power consumption of the semiconductor device can be reduced.

DETAILED DESCRIPTION OF THE INVENTION

Embodiment Modes

Figure 1A:
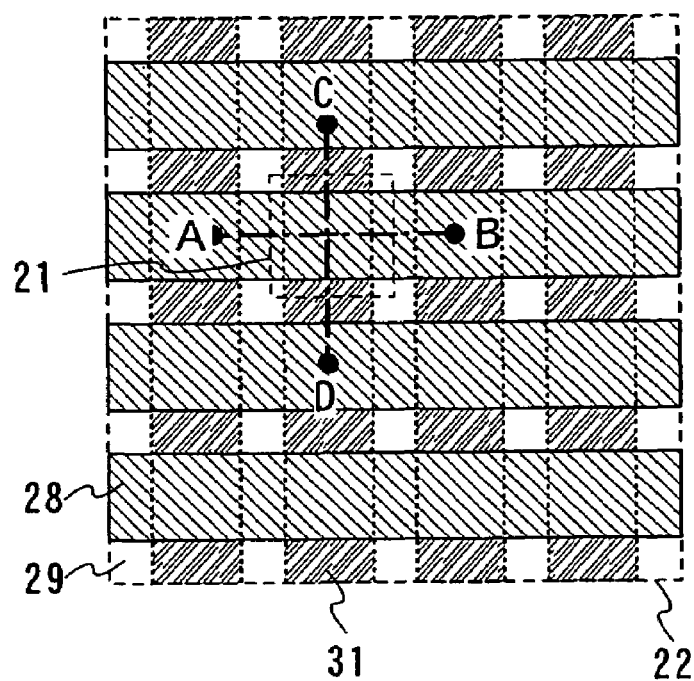
FIGS. 1A and 1B are top and cross-sectional views for describing a semiconductor device of the present invention.

Embodiment modes and embodiments of the present invention will be described with reference to the drawings. However, it is easily understood by those skilled in the art that the mode and detail can be variously modified without departing from the scope and spirit of the present invention. Therefore, the present invention is not construed as being limited to the description of embodiment modes and embodiments. It is to be noted that reference numeral indicating the same part is used in common in different drawings in the structures of the present invention hereinafter described.

Embodiment Mode 1

Embodiment Mode 1 will describe a structural example of a storage element in a semiconductor device of the present invention with reference to the drawings. More specifically, a case of a passive matrix semiconductor device is shown.

Figure 5A:
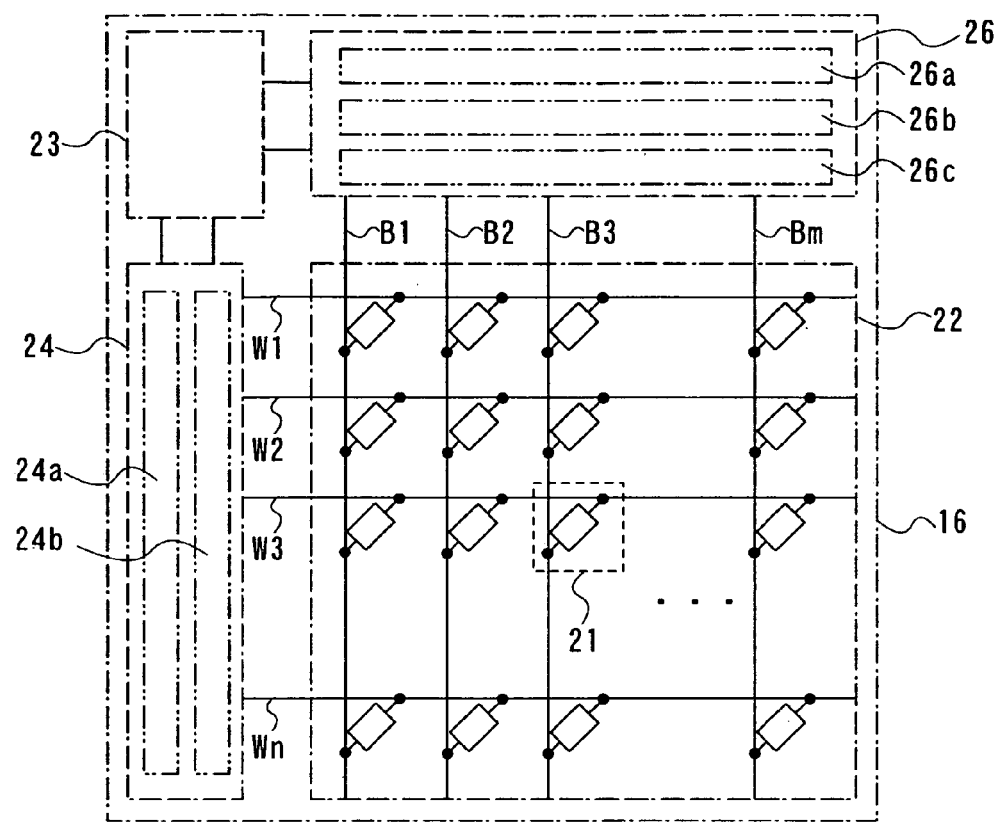
FIGS. 5A to 5C are views for describing a semiconductor device of the present invention.

FIG. 5A shows a structural example of a storage element of this embodiment mode, which includes a memory cell array 22 in which memory cells 21 are arranged in matrix; a bit line driver circuit 26 having a column decoder 26a, a reading/writing circuit 26b, and a selector 26c; a word line driver circuit 24 having a row decoder 24a and a level shifter 24b; and an interface 23 having a writing circuit and the like, that communicates with outside. The structure of the storage circuit 16 shown here is just an example and the storage circuit 16 may have other circuits such as a sense amplifier, an output circuit, and a buffer, and the writing circuit may be provided in the bit line driver circuit.

The memory cell 21 has a first conductive layer that forms a bit line Bx ($1 \leq x \leq m$), a second conductive layer that forms a word line Wy ($1 \leq y \leq n$), and an organic compound layer that is in contact with the first conductive layer. The organic compound layer is provided in a single layer or multilayer structure between the first conductive layer and the second conductive layer.

Figure 1B:
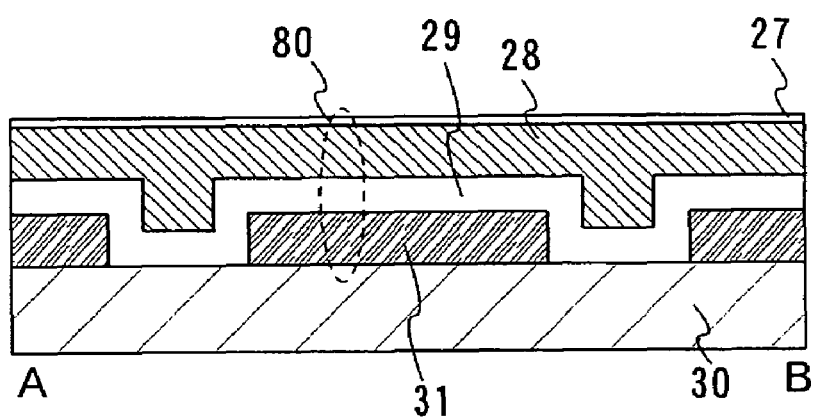

Examples of a top surface structure and a cross sectional structure of the memory cell array 22 are shown in FIGS. 1A and 1B. FIG. 1A shows a top surface structure of the memory cell array 22 and FIG. 1B shows a cross-sectional structure taken along a line A-B in FIG. 1A. In FIG. 1A, an insulating layer 27 is omitted.

In the memory cell array 22, memory cells 21 are arranged in matrix (see FIG. 1A). The memory cell 21 has a storage element 80 (see FIG. 1B). The storage element 80 has a first conductive layer 31 extending in a first direction, an organic compound layer 29 covering the first conductive layer 31, and a second conductive layer 28 extending in a second direction which is perpendicular to the first direction over a substrate 30. Prior to data writing, the organic compound layer 29 keeps the distance constant between the first conductive layer 31 and the second conductive layer 28. Then, the insulating layer 27 functioning as a protective film is provided so as to cover the second conductive layer 28.

In the storage element 80 of the present invention, data writing is carried out in such a way that the first conductive layer 31 and the second conductive layer 28 are shorted by applying voltage to the first conductive layer 31 and the second conductive layer 28 to generate an electric field in the storage element.

Figure 2A:
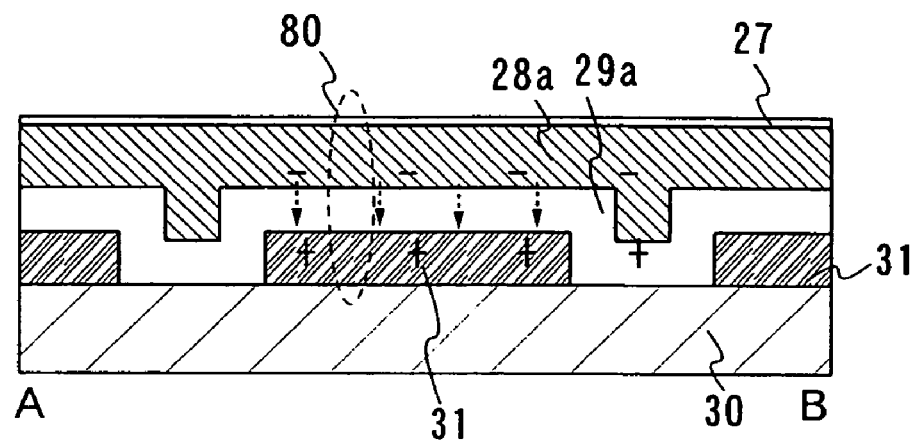
FIGS. 2A and 2B are cross-sectional views for describing a semiconductor device of the present invention.
Figure 2B:
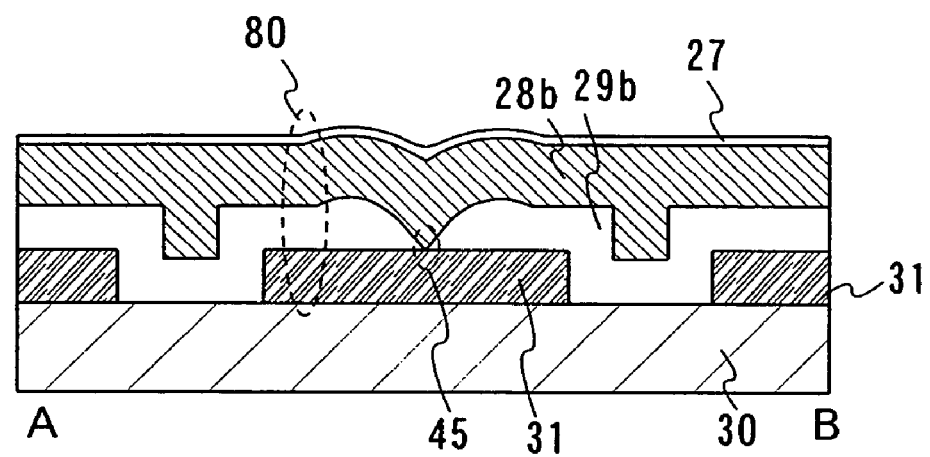

As shown in FIGS. 2A and 2B, a charge is generated in each conductive layer when voltage is applied to the first conductive layer 31 and the second conductive layer 28 in the storage element 80 to generate an electric field. In FIG. 2A, a hole is generated in the first conductive layer 31 and an electron is generated in a second conductive layer 28a. Coulomb force is generated in the first conductive layer 31 and the second conductive layer 28a in such states. When voltage at or over a certain level is applied to the first conductive layer and the second conductive layer, at least parts of the first conductive layer 31 and the second conductive layer 28b come into contact with each other (shorted) by such a behavior that the first conductive layer 31 gets closer to the second conductive layer 28a or the second conductive layer 28a gets closer to the first conductive layer 31 as indicated by arrows in FIG. 2A. Thus, electrical resistance of the storage element 80 is changed. That is, Coulomb force of the charge in the first conductive layer 31 and the second conductive layer 28a is one factor for shorting the first conductive layer 31 and the second conductive layer 28a. In this way, data writing is carried out by changing the electrical resistance between the two conductive layers with the use of an electric field generated by applying voltage. In FIG. 2B, a reference numeral 29b denotes a deformed organic compound layer, and a reference numeral 45 denotes a region where the first conductive layer 31 and the second conductive layer 28b are shorted. In the case of writing data in the memory cell, forward voltage is applied. Alternatively, reverse voltage may be applied.

Figure 3A:
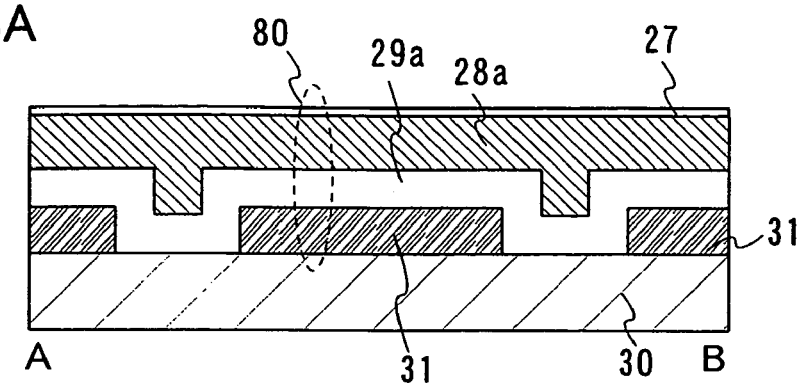
FIGS. 3A to 3C are cross-sectional views for describing a semiconductor device of the present invention.
Figure 3B:
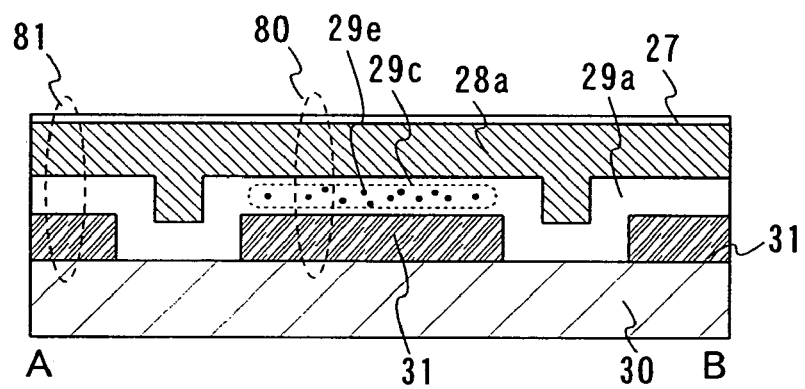
Figure 3C:
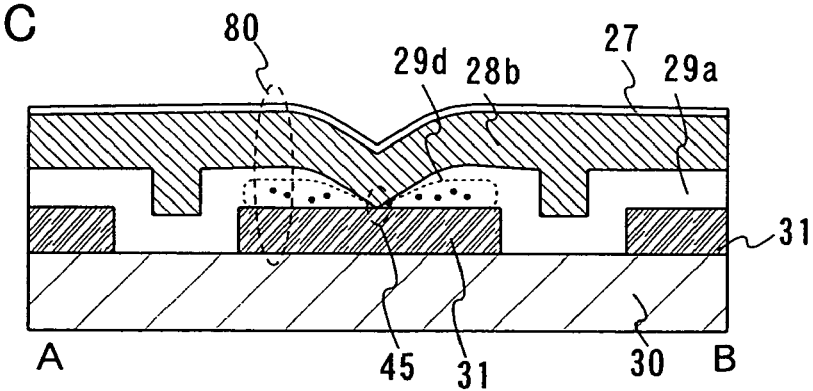

If an electric field is generated by applying voltage at or over a certain level to the first conductive layer 31 and the second conductive layer 28a as shown in FIG. 3A, an organic compound is reacted or decomposed in a part of an organic compound layer 29a. As a result, as shown in FIG. 3B, a region 29c including an organic compound 29e, which is different from an organic compound in the organic compound layer 29a of another storage element 81, is formed. At the same time, the region 29c including the different organic compound is heated by the reaction heat at about or over a glass transition point, gets fluidity, is deformed, and therefore has inhomogeneous film thickness. Accordingly, as shown in FIG. 3C, the first conductive layer 31 and the second conductive layer 28b are shorted, whereby the electrical resistance of the storage element is changed. In other words, the deformation of the organic compound layer due to the reaction heat of the organic compound is one factor for shorting the first conductive layer and the second conductive layer. In FIG. 3C, a reference numeral 29d denotes a deformed organic compound layer, and a reference numeral 45 denotes a region where the first conductive layer and the second conductive layer are shorted. In the case of writing data in the memory cell, forward voltage is applied. Alternatively, reverse voltage may be applied.

As the distance between the first conductive layer 31 and the second conductive layer 28a is shorter, the electric field strength of the organic compound layer 29a increases. As a result, the reaction of the organic compound layer 29a progresses, the reaction heat is easily generated, and Coulomb force of the charge generated in each conductive layer also increases. Therefore, writing at low voltage becomes possible.

Further, writing is carried out easily by both of shorting between the first conductive layer and the second conductive layer by Coulomb force and shorting between the conductive layers by fluidity of layers containing different organic compounds from the organic compound layers of other storage elements. In other words, the layers containing different organic compounds have fluidity by applying voltage, and at the same time, Coulomb force of the charge in the conductive layers is generated, whereby the first conductive layer and the second conductive layer are easily shorted.

In the case of applying voltage to the first conductive layer and the second conductive layer of the storage element, it is preferable that a resistor be connected serially to the storage element. The resistor preferably has a resistance value of 5% or lower of that of the storage element. Accordingly, in the shorted storage element, excessive current flow can be prevented. Thus, it is possible to prevent the storage element from being broken by excessive current flow.

Since writing in the storage element of the present invention is carried out by using an electric field generated in the storage element, it is possible to decrease a current value at the writing. Moreover, by decreasing the area of the storage element and the distance between the conductive layers in the storage element, writing voltage can be decreased. Therefore, the characteristics of the storage element can be increased.

Next, a structure of the storage element is described. In the structure of the aforementioned storage element 80, a substrate 30 may be any of a quartz substrate, a silicon substrate, a metal substrate, a stainless steel substrate, paper made of a fibrous material, and the like, in addition to a glass substrate and a flexible substrate. A flexible substrate is a substrate that can be bent and, for example, a plastic substrate made of polycarbonate, polyarylate, polyethersulfone, or the like is given. Moreover, a film having a thermoplastic resin layer (made of polypropylene, polyester, vinyl, polyvinyl fluoride, vinyl chloride, or the like) can be used. In addition, the memory cell array 22 can be provided over a field effect transistor (FET) formed over a semiconductor substrate made of Si or the like or a thin film transistor (TFT) formed over a substrate made of glass or the like.

The first conductive layer 31 and the second conductive layer 28 can be formed in a single layer or multilayer structure with metal, alloy, a compound, or the like each of which has high conductivity. Typically, metal, alloy, a conductive compound, or a mixture of these, each of which has a high work function (specifically, 4.0 eV or higher); metal, alloy, a conductive compound, or a mixture of these, each of which has a low work function (specifically, 3.8 eV or lower); or the like can be used.

As typical examples of the metal, alloy, and conductive compound having a high work function (specifically 4.0 eV or higher), indium tin oxide (hereinafter referred to as ITO), indium tin oxide containing silicon, indium oxide containing 2 to 20% of zinc oxide (ZnO), and the like are given. Moreover, it is possible to use titanium (Ti), gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride (TiN), tungsten nitride (WN), or molybdenum oxide (MoN)), or the like.

As typical examples of the metal, alloy, and conductive compound having a low work function (specifically 3.8 eV or lower), metal of Group 1 or 2 in the periodic table, i.e., alkali metal such as lithium (Li) or cesium (Cs); alkaline earth metal such as magnesium (Mg), calcium (Ca), or strontium (Sr); alloy containing any of these (such as MgAg or AlLi); rare-earth metal such as europium (Er) or ytterbium (Yb); alloy containing any of these; and the like are given.

When an electrode for injecting holes to the organic compound layer, i.e., an anode is formed using the first conductive layer 31 and the second conductive layer 28, it is preferable to use a material having a high work function. On the contrary, when an electrode for injecting electrons to the organic compound layer is formed using the first conductive layer 31 and the second conductive layer 28, it is preferable to use a material having a low work function.

The first conductive layer 31 is formed by an evaporation method, a sputtering method, a CVD method, a printing method, an electrolytic plating method, an electroless plating method, or the like.

The second conductive layer 28 can be formed by an evaporation method, a sputtering method, a CVD method, a printing method, or the like. Here, a droplet discharging method is a method in which a droplet including a composition that contains particulates is discharged from a small orifice to form a pattern having a predetermined shape.

Here, the first conductive layer 31 is formed by forming a titanium film with a thickness of 50 to 200 nm by a sputtering method and etching the titanium film into a desired shape by a photolithography method. Moreover, an aluminum film with a thickness of 50 to 200 nm is formed as the second conductive layer 28 by an evaporation method.

The organic compound layer 29 is formed with an organic compound whose crystal condition, conductivity, and shape are changed by voltage applied to the first conductive layer and the second conductive layer. The organic compound layer 29 may be formed in a single layer structure or a multilayer structure by stacking layers formed with different organic compounds.

The organic compound layer 29 is formed with such a thickness that the electrical resistance of the storage element changes by applying voltage from outside. The typical film thickness of the organic compound layer 29 ranges from 5 to 100 nm, preferably 10 to 60 nm.

The organic compound layer 29 can be formed with an organic compound having a hole-transporting property or an organic compound having an electron-transporting property.

As the organic compound having a hole-transporting property, for example, an aromatic amine compound (that is, a compound having a benzene ring-nitrogen bond), phthalocyanine (abbreviated to $H_2Pc$), or a phthalocyanine compound such as copper phthalocyanine (abbreviated to CuPc) or vanadyl phthalocyanine (abbreviated to VOPc) can be used. The aromatic amine compound is, for example, 4,4'-bis [N-(1-naphthyl)-N-phenyl-amino]-biphenyl (abbreviated to α-NPD); 4,4'-bis[N-(3-methylphenyl)-N-phenyl-amino]-biphenyl (abbreviated to TPD); 4,4',4"-tris(N,N-diphenyl-amino)-triphenylamine (abbreviated to TDATA); 4,4',4"-tris [N-(3-methylphenyl)-N-phenyl-amino]-triphenylamine (abbreviated to MTDATA); 4,4'-bis(N-(4-(N,N-di-m-tolylamino)phenyl)-N-phenylamino)biphenyl (abbreviated to DNTPD); or the like. The substances mentioned here mainly have a hole mobility of $10^{-6}$ $cm^2/Vs$ or higher.

As the organic compound having an electron-transporting property, the following material with a metal complex having a quinoline skeleton or a benzoquinoline skeleton, or the like can be used: tris(8-quinolinolato)aluminum (abbreviated to $Alq_3$), tris(4-methyl-8-quinolinolato)aluminum (abbreviated to $Almq_3$), bis(10-hydroxybenzo[h]-quinolinolato)beryllium (abbreviated to $BeBq_2$), or bis(2-methyl-8-quinolinolato)-4-phenylphenolato-aluminum (abbreviated to BAlq). Besides, a metal complex having an oxazole or thiazole ligand, such as bis[2-(2-hydroxyphenyl)benzoxazolato]zinc (abbreviated to $Zn(BOX)_2$) or bis[2-(2-hydroxyphenyl)benzothiazolato]zinc (abbreviated to $Zn(BTZ)_2$), or the like can be used. In addition to the metal complex, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), or the like can be used. The substances mentioned here mainly have an electron mobility of $10^{-6}$ $cm^2/Vs$ or higher.

The organic compound layer 29 can be formed by an evaporation method, an electron beam evaporation method, a sputtering method, a CVD method, or the like. Moreover, as another method for forming the organic compound layer 29, a spin coating method, a sol-gel method, a printing method, a droplet discharging method, or the like may be used, and these methods may be combined with the above methods.

In order to change the hole-transporting property or the electron-transporting property of the organic compound layer 29, the organic compound layer 29 including a plurality of organic compounds having different charge-transporting properties may be formed. Such an organic compound layer can be formed by co-evaporating organic compounds having different charge-transporting properties.

Moreover, in order to change the hole-transporting property or the electron-transporting property of the organic compound layer 29, the organic compound layer 29 may be formed with an organic compound and an insulator. Such an organic compound layer can be formed by co-evaporating an organic compound and an insulator or by adding an insulator to an organic compound layer. As the insulator, oxide having an insulating property typified by MgO, CaO, SrO, BaO, $Sc_2O_3$, $ZrO_2$, $Fe_2O_3$, CoO, PdO, $Ag_2O$, $Al_2O_3$, or the like; fluoride having an insulating property typified by LiF, KF, $CaF_2$, or the like; chloride having an insulating property typified by LiCl, NaCl, KCl, $BeCl_2$, $CaCl_2$, $BaCl_2$, or the like; bromide having an insulating property typified by KBr, CsBr, AgBr, or the like; iodide having an insulating property typified by NaI, KI, $BaI_2$, or the like; carbonate having an insulating property typified by $MgCO_3$, $CaCO_3$, $SrCO_3$, $BaCO_3$, $MnCO_3$, $FeCO_3$, $CoCO_3$, or the like; hydrosulfate having an insulating property typified by $Li_2SO_4$, $K_2SO_4$, $Na_2SO_4$, $MgSO_4$, $CaSO_4$, $SrSO_4$, $BaSO_4$, or the like; and nitride having an insulating property typified by AlN or SiN are given.

Figure 4A:
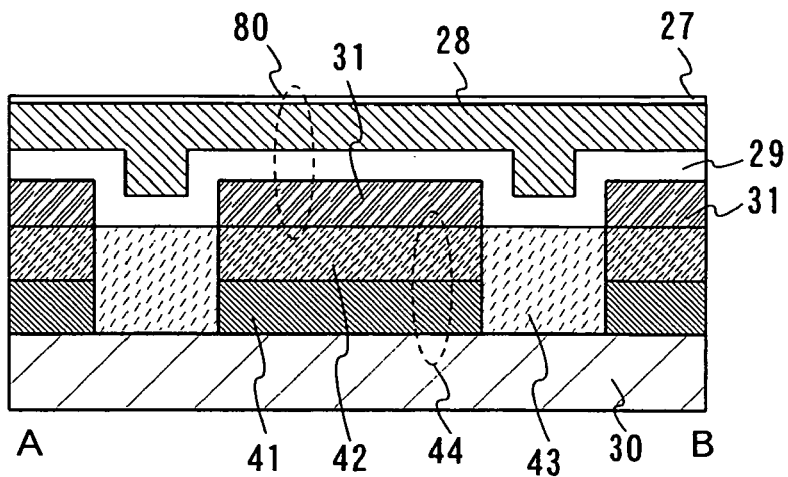
FIGS. 4A to 4C are cross-sectional views for describing a semiconductor device of the present invention.

In the storage element, an element having a rectifying property may be provided under the organic compound layer 29 with the first conductive layer 31 interposed therebetween (FIG. 4A). As the element having a rectifying property, a transistor in which a gate electrode is connected to a drain electrode, or a diode is given. Here, a diode 44 including a third conductive layer 41 and a semiconductor layer 42 is provided in contact with the first conductive layer 31. The element having a rectifying property may be provided over the organic compound layer with the second conductive layer interposed therebetween. Moreover, the element having a rectifying property may be provided between the organic compound layer 29 and the first conductive layer 31 or between the organic compound layer 29 and the second conductive layer 28. As a typical example of the diode, a PN junction diode, a PIN junction diode, an avalanche diode, or the like is given. Alternatively, a diode having another structure may be used. By providing the element having a rectifying property, current flows only in one direction, whereby errors are decreased and reading margin is improved. An insulating layer 43 is provided between the diodes.

A thin film transistor (TFT) may be provided over an insulating substrate and the storage element 80 may be provided over the thin film transistor. Alternatively, a field effect transistor (FET) may be formed over a semiconductor substrate made of Si or the like or an SOI substrate instead of the insulating substrate, and the storage element 80 may be provided over the field effect transistor. Although an example in which the storage element is formed over the thin film transistor or the field effect transistor is shown here, the storage element may be provided in such a way that the storage element is pasted to the thin film transistor or the field effect transistor. In the latter case, a storage element portion and the thin film transistor or the field effect transistor are manufactured in separate steps, and after that, the storage element portion and the thin film transistor or the field effect transistor are pasted to each other with a conductive film, an anisotropic conductive adhesive, or the like. Moreover, any known structure is applicable as the structure of the thin film transistor or the field effect transistor.

If an effect of an electric field in a lateral direction between the adjacent storage elements is concerned, a partition wall (insulating layer) may be provided between the organic compound layers provided in the respective storage elements in order to separate the organic compound layers provided in the respective storage elements. In other words, the organic compound layer may be selectively provided for each memory cell.

Figure 4B:
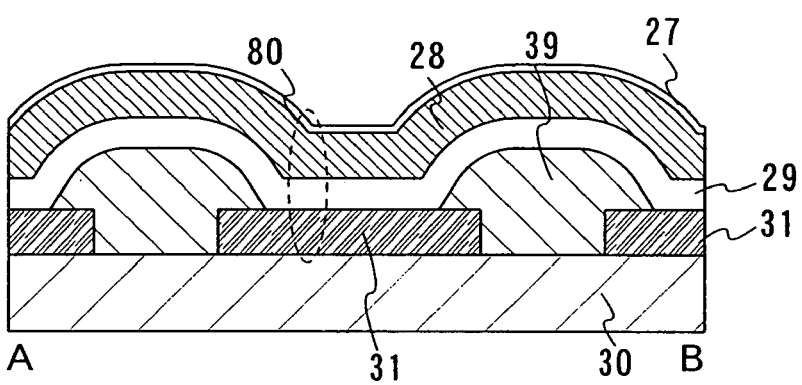

Moreover, a partition wall 39 (insulating layer) may be provided between the first conductive layers 31 in order to prevent an effect of an electric field in a lateral direction between the memory cells or disconnection of the organic compound layer 29 by a step of the first conductive layer 31 when the organic compound layer 29 is provided covering the first conductive layer 31 (FIG. 4B). At a cross section of the partition wall (insulating layer) 39, a side surface of the partition wall (insulating layer) 39 preferably has a tilt angle of 10 to 60°, preferably 25 to 45° with respect to a surface of the first conductive layer 31. Moreover, it is preferable that an upper end portion of the partition wall (insulating layer) 39 be curved. After that, the organic compound layer 29, the second conductive layer 28, and the insulating layer 27 are formed so as to cover the first conductive layer 31 and the partition wall (insulating layer) 39.

Figure 4C:
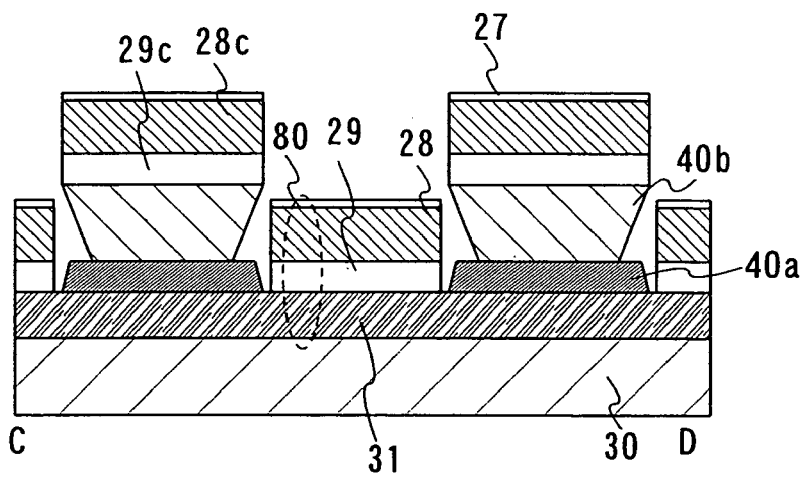

Instead of the partition wall (insulating layer) 39, an interlayer insulating layer 40a covering a part of the first conductive layer 31 and a partition wall (insulating layer) 40b provided over the interlayer insulating layer 40a may be formed over the first conductive layer 31 extending in the first direction over the substrate 30 (FIG. 4C). FIG. 4C is a cross-sectional view taken along a line C-D of FIG. 1A.

The interlayer insulating layer 40a covering a part of the first conductive layer 31 has an opening portion for each storage element 80. Moreover, the partition wall (insulating layer) 40b is provided in a region of the interlayer insulating layer where the opening portion is not formed. The partition wall (insulating layer) 40b extends in the second direction similarly to the second conductive layer 28. A cross section of a sidewall of the partition wall (insulating layer) 40b has a tilt angle of 95° or more and 135° or less to a surface of the interlayer insulating layer 40a.

The partition wall (insulating layer) 40b is formed with a positive photosensitive resin for which a not-light-exposed part remains, in such a way that the amount of light exposure and developing time are adjusted so that a lower part of the pattern is etched more by a photolithography method. Moreover, the height of the partition wall (insulating layer) 40b is set larger than the thickness of the organic compound layer 29 and the second conductive layer 28. As a result, only by the step of evaporating the organic compound layer 29 and the second conductive layer 28 over the whole surface of the substrate 30, the stripe-shaped organic compound layer 29 and second conductive layer 28 which are separated into a plurality of regions that are electrically independent and which extend in a direction intersecting with the first direction can be formed. Therefore, the number of steps can be decreased. Although the organic compound layer 29c and the conductive layer 28c are formed over the partition wall (insulating layer) 40b, the organic compound layer 29c and the conductive layer 28c are separated from the organic compound layer 29 and the conductive layer 28.

Next, operation for writing data in an organic memory is described. A case of carrying out data writing by applying voltage is described (see FIGS. 5A to 5C).

In the case of carrying out data writing by applying voltage, one memory cell 21 is selected by the row decoder 24a, the column decoder 26a, and the selector 26c and after that, data are written in the memory cell 21 by using the writing circuit (see FIG. 5A).

The writing is carried out by changing the electrical characteristic of the memory cell. It is assumed that the memory cell in an initial state (a state in which an electric action is not added) has data "0" and the memory cell in a state that the electrical characteristic has been changed has data "1".

In the case of writing the data "1" in the memory cell 21, the memory cell 21 is selected first by the row decoder 24a, the column decoder 26a, and the selector 26c. Specifically, a predetermined voltage of V2 is applied to a word line W3 connected to the memory cell 21 by the row decoder 24a. Moreover, a bit line B3 connected to the memory cell 21 is connected to the reading/writing circuit 26b by the column decoder 26a and the selector 26c. Then, a writing voltage of V1 is outputted from the reading/writing circuit 26b to the bit line B3. Thus, a voltage of Vw=V1−V2 is applied between the first conductive layer 31 and the second conductive layer 28 that form the memory cell 21. By selecting the voltage Vw appropriately, the organic compound layer 29 provided between the conductive layers is changed physically or electrically, so that the data "1" is written. Specifically, the organic compound layer 29 may be changed so that the electrical resistance between the first conductive layer and the second conductive layer in a state of having the data "1" is much smaller than that in a state of having the data "0" at reading operation voltage. For example, the selection may be appropriately made from the range (V1, V2)=(0 V, 5 to 15 V) or (3 to 5 V, −12 to −2 V). The voltage Vw may be set in the range of 5 to 15 V or −5 to −15 V.

The voltage is controlled so that the data "1" is not written in the memory cells connected to non-selected word lines and non-selected bit lines. For example, the non-selected word lines and non-selected bit lines may be in a floating state. It is necessary that the first conductive layer 31 and the second conductive layer 28 that form the memory cell have a characteristic capable of securing selectivity, such as a diode characteristic.

On the other hand, in the case of writing the data "0" in the memory cell 21, voltage is not applied between the first conductive layer 31 and the second conductive layer 28 of the memory cell. At circuit operation, the memory cell 21 is selected by the row decoder 24a, the column decoder 26a, and the selector 26c similarly to the case of writing the data "1"; however, an output potential from the reading/writing circuit 26b to the bit line B3 is set so as to be similar to a potential of the selected word line W3 or potentials of the non-selected word lines and voltage of such a degree that the electrical characteristic of the memory cell 21 does not change (for example −5 to 5 V) may be applied between the first conductive layer 31 and the second conductive layer 28 that form the memory cell 21.

For example, if the organic compound layer to which voltage is not applied has the data of "0", the data of "1" can be written by applying high voltage selectively between the conductive layers of a desired storage element for shorting to make the electrical resistance small.

Figure 5B:
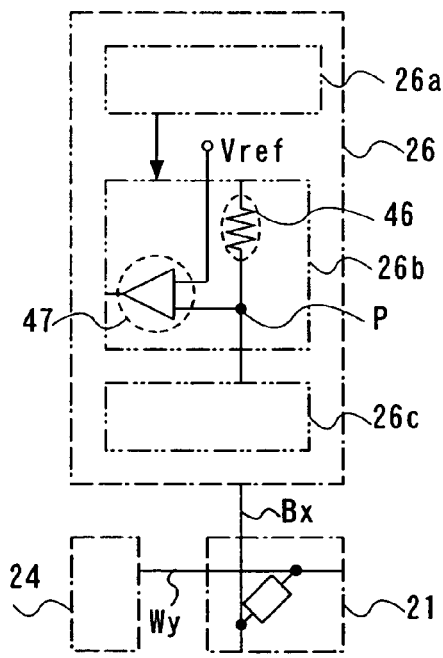
Figure 5C:
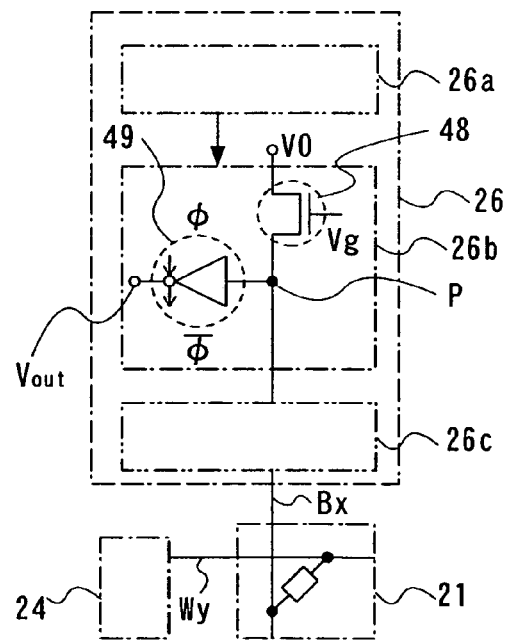

Subsequently, operation for reading data from an organic memory is described (FIG. 5B). The data reading is carried out by using the difference between the memory cell having the data "0" and the memory cell having the data "1" in the electrical characteristic between the first conductive layer and the second conductive layer that form the memory cell. For example, effective electrical resistance between the first conductive layer and the second conductive layer that form the memory cell having the data "0" (hereinafter the effective electrical resistance is simply referred to as electrical resistance of the memory cell) is assumed to be R0 at the reading voltage while the electrical resistance of the memory cell having the data "1" is assumed to be R1 at the reading voltage, based on which a method of reading the data by using the difference in the electrical resistance is described. It is noted that R1<<R0. Here, the reading circuit 26b includes a resistor element 46 and a sense amplifier 47, the resistor element 46 has a resistance value Rr, and R1<Rr<R0. However, the structure of the reading circuit 26b is not limited to the above structure but may be any structure. For example, a transistor 48 may be provided instead of the resistor element 46 and a clocked inverter 49 may be used instead of the sense amplifier 47 (FIG. 5C). A signal φ or an inverted signal φ, which becomes Hi when reading is carried out and Lo when reading is not carried out, is inputted to the clocked inverter 49.

At data reading, the memory cell 21 is selected by the row decoder 24a, the column decoder 26a, and the selector 26c. Specifically, a predetermined voltage of Vy is applied to the word line Wy connected to the memory cell 21 by the row decoder 24a. Moreover, the bit line Bx connected to the memory cell 21 is connected to a terminal P of the reading/writing circuit 26b by the column decoder 26a and the selector 26c. As a result, a potential Vp of the terminal P turns to be a value that is determined by resistance division by the resistor element 46 (resistance value Rr) and the memory cell 21 (resistance value R0 or R1). Therefore, if the memory cell 21 has the data "0", Vp0=Vy+(V0−Vy)×R0/(R0+Rr). If the memory cell 21 has the data "1", Vp1=Vy+(V0−Vy)×R1/(R1+Rr). Accordingly, Vref is selected so as to be between Vp0 and Vp1 in FIG. 9A and a point of change of the clocked inverter is selected so as to be between Vp0 and Vp1 in FIG. 9B. Thus, Lo/Hi (or Hi/Lo) is outputted as an output potential Vout in accordance with the data "0"/"1", thereby carrying out data reading.

For example, the sense amplifier 47 is operated at Vdd=3 V, and the Vy is set to be 0 V, the V0 is set to be 3 V, and the Vref is set to be 1.5 V. If R0/Rr=Rr/R1=9, Vp0 is 2.7 V and Hi is outputted as Vout when the data of the memory cell is "0", while Vp1=0.3 V and Lo is outputted as Vout when the data of the memory cell is "1". Thus, data reading from the memory cell can be carried out.

As described above, in the case of writing data by applying voltage, the resistance value R0 when voltage is not applied and the resistance value R1 when the two conductive layers are shorted by applying voltage satisfy R1>R0. By electrically reading the difference in such resistance values, data reading may be carried out.

According to the above method, the state of the electrical resistance of the organic compound layer 29 is read by the voltage value, using the difference in the resistance value and the resistance division. The reading method is not limited to this method. For example, in addition to the method using the difference in the electrical resistance, a reading method using a difference in a current value is also applicable. Moreover, in the case where the electrical characteristic of the memory cell has a diode characteristic in which threshold voltage is different between the data "0" and "1", reading may be carried out by using a difference in the threshold voltage. Furthermore, a method in which a bit line is precharged can also be employed.

In the case of reading data, forward voltage is applied. Alternatively, reverse voltage may be applied.

By applying the present invention, it is possible to write (additionally record) data at a time other than during manufacturing a chip but impossible to rewrite the data. Thus, a semiconductor device capable of preventing forgery due to rewriting can be provided. Moreover, since the semiconductor device of the present invention has a storage element having a simple structure in which an organic compound layer is sandwiched between a pair of conductive layers, the semiconductor device can be inexpensive. Furthermore, since data are written in the semiconductor device of the present invention by using an electric field generated in the storage element, it is possible to decrease a current value at the writing. By decreasing the area of the storage element, it is possible to decrease the current value flowing in the storage element at the writing. In addition, by decreasing the distance between the conductive layers in the storage element, the writing voltage can be decreased. Therefore, the characteristics of the storage element can be improved. Accordingly, the power consumption of the semiconductor device can be reduced.

Embodiment Mode 2

Embodiment Mode 2 will describe a semiconductor device having a structure which is different from that shown in Embodiment Mode 1. Specifically, a case of an active matrix semiconductor device will be shown.

Figure 6A:
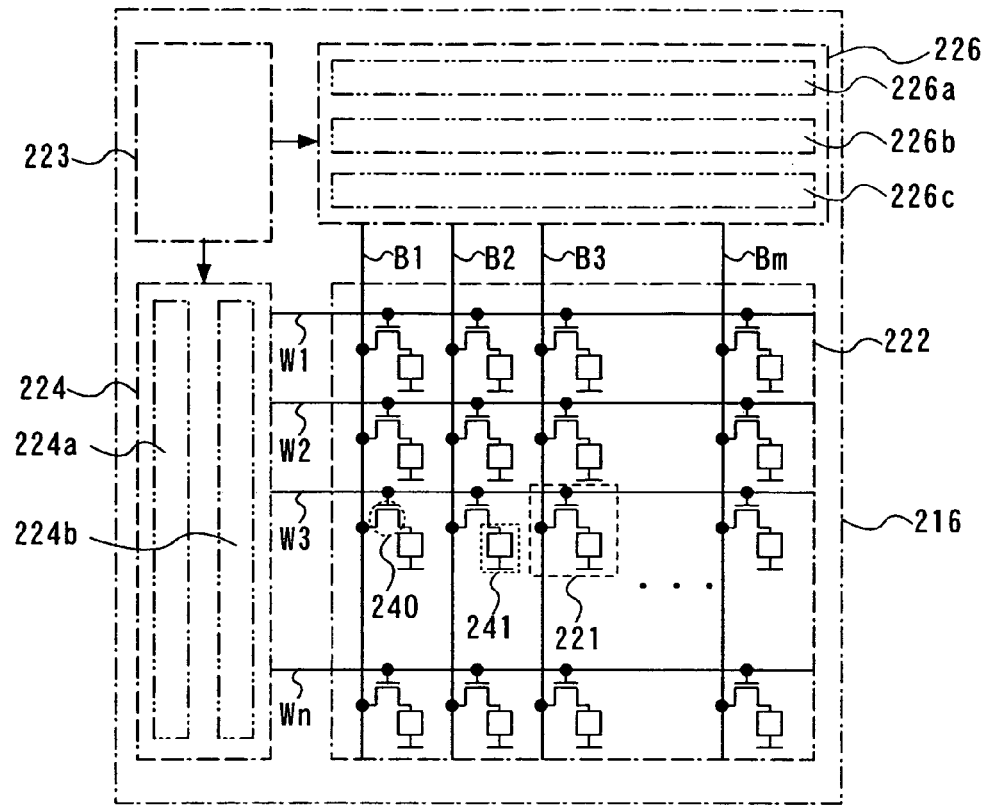
FIGS. 6A to 6C are views for describing a semiconductor device of the present invention.

FIG. 6A shows a structural example of a semiconductor device described in Embodiment Mode 2. A memory cell array 222 in which memory cells 221 are arranged in matrix; a bit line driver circuit 226 including a column decoder 226a, a reading/writing circuit 226b, and a selector 226c; a word line driver circuit 224 including a row decoder 224a and a level shifter 224b; and an interface 223 including a writing circuit and the like, which communicates with outside are provided. The structure of a storage circuit 216 shown here is just an example and the storage circuit 216 may further include other circuits, such as a sense amplifier, an output circuit, and a buffer, and the writing circuit may be provided in the bit line driver circuit.

The memory cell 221 has a first wire that forms a bit line Bx ($1 \leq x \leq m$), a second wire that forms a word line Wy ($1 \leq y \leq n$), a transistor 240, and a storage element 241. The storage element 241 has a structure in which an organic compound layer is sandwiched between a pair of conductive layers.

Figure 7A:
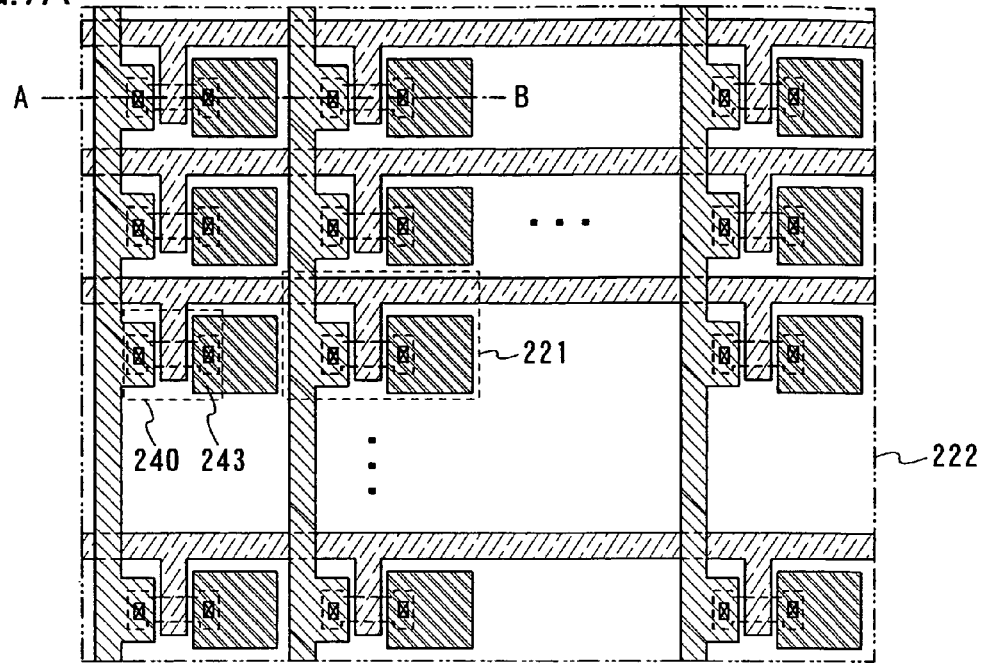
FIGS. 7A to 7C are top and cross-sectional views for describing a semiconductor device of the present invention.
Figure 7B:
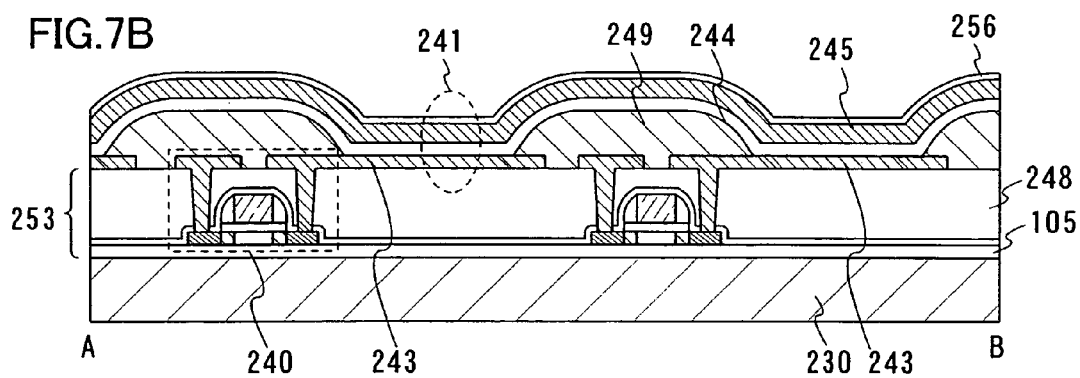

Next, an example of the memory cell array 222 having the above structure is described with reference to its top and cross-sectional views shown in FIGS. 7A to 7C. FIG. 7A shows an example of a top view of the memory cell array 222 while FIG. 7B shows a cross-sectional view taken along a line A-B in FIG. 7A. In FIG. 7A, a partition wall (insulating layer) 249, an organic compound layer 244, a second conductive layer 245 and an insulating layer 256, which are formed over a first conductive layer 243, are omitted.

In the memory cell array 222, a plurality of memory cells 221 are formed in matrix. The memory cell 221 has a transistor 240 functioning as a switching element and a storage element 241 connected to the transistor 240, over a substrate 230 having an insulating surface (see FIGS. 7A and 7B). The storage element 241 has the first conductive layer 243 formed over an insulating layer 248, the partition wall (insulating layer) 249 covering a part of the first conductive layer, the organic compound layer 244 covering the first conductive layer 243 and the partition wall (insulating layer) 249, and the second conductive layer 245. A thin film transistor is used as the transistor 240. Further, an insulating layer 256 functioning as a protective film which covers the second conductive layer 245 is provided.

Figure 15A:
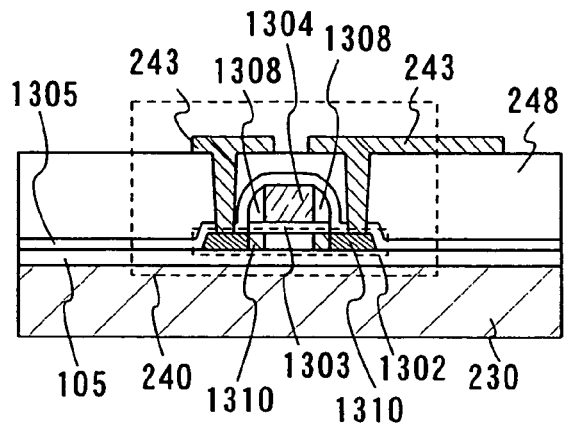
FIGS. 15A to 15D are cross-sectional views for describing a semiconductor device of the present invention.

A mode of a thin film transistor which can be used as the transistor 240 is described with reference to FIGS. 15A to 15D. FIG. 15A shows an example in which a top gate thin film transistor is applied as the transistor 240. An insulating layer 105 is provided over the substrate 230 having an insulating surface, and a thin film transistor is provided over the insulating layer 105. In the thin film transistor, a semiconductor layer 1302 is formed over the insulating layer 105 and an insulating layer 1303 which can function as a gate insulating layer is provided over the semiconductor layer 1302. Over the insulating layer 1303, a gate electrode 1304 is formed in response to the semiconductor layer 1302, and an insulating layer 1305 functioning as a protective layer and an insulating layer 248 functioning as an interlayer insulating layer are provided over the gate electrode 1304. Then, the first conductive layer 243 to be connected to each of a source region and a drain region of the semiconductor layer is formed. Over the first conductive layer 243, an insulating layer functioning as a protective layer may be formed.

The semiconductor layer 1302 is a layer formed with a semiconductor having a crystal structure, and a non-single crystal semiconductor or a single-crystal semiconductor can be used. In particular, it is preferable to apply a crystalline semiconductor obtained by crystallizing an amorphous or microcrystalline semiconductor through laser irradiation, a crystalline semiconductor obtained by crystallizing through a heat treatment, or a crystalline semiconductor obtained by crystallizing through a combination of laser irradiation and a heat treatment. In the heat treatment, a crystallization method using a metal element which can promote crystallization of a silicon semiconductor, such as nickel, can be applied.

In the case of the crystallization through laser irradiation, the crystallization can be carried out by using a continuous wave laser beam or a pulsed laser beam with a repetition rate of 10 MHz or higher and a pulse width of 1 ns or shorter, preferably 1 to 100 ps, in such a way that a melt zone in which the crystalline semiconductor is melted is moved continuously in a direction where the laser beam is delivered. By this crystallization method, a crystalline semiconductor in which crystal grain boundaries extend in one direction and grain diameter is large can be obtained. By matching a direction where carriers drift to the direction where the crystal grain boundaries extend, the electric field effect mobility of the transistor can be increased. For example, a mobility of 400 $cm^2/V \cdot sec$ or higher can be achieved.

In the case of applying the above crystallization step to a crystallization process at or below the upper temperature limit of a glass substrate (about 600° C.), a large glass substrate can be used. Therefore, it is possible to manufacture a large number of semiconductor devices per substrate, thereby decreasing the manufacturing cost.

The semiconductor layer 1302 may be formed by a crystallization step through a heat treatment at or over the upper temperature limit of a glass substrate. Typically, a quartz substrate is used as the substrate 230 having an insulating surface, and an amorphous or microcrystalline semiconductor is heated at 700° C. or higher to form the semiconductor layer 1302. As a result, a semiconductor with superior crystallinity can be formed. Thus, a thin film transistor which has favorable characteristics such as high response speed and high mobility and which can operate at high speed can be provided.

The gate electrode 1304 can be formed with metal or a polycrystalline semiconductor doped with an impurity imparting one conductivity type. In the case of using metal, tungsten (W), molybdenum (Mo), titanium (Ti), tantalum (Ta), aluminum (Al), or the like can be used. Moreover, metal nitride obtained by nitriding metal can be used. Alternatively, a first layer including the metal nitride and a second layer including the metal may be stacked. In the case of a multilayer structure, such a shape is applicable that an end portion of the first layer sticks out to the outside farther than an end portion of the second layer. By forming the first layer with metal nitride, the first layer can be barrier metal. In other words, the metal of the second layer can be prevented from diffusing to the insulating layer 1303 or the semiconductor layer 1302 thereunder.

For side surfaces of the gate electrode 1304, sidewalls (sidewall spacers) 1308 may be formed. Each sidewall can be formed by forming an insulating layer that is formed with silicon oxide by a CVD method over a substrate and then anisotropically etching the insulating layer by an RIE (reactive ion etching) method.

For the thin film transistor which is formed by combining the semiconductor layer 1302, the insulating layer 1303, the gate electrode 1304, and the like, various structures such as a single drain structure, an LDD (Lightly-Doped Drain) structure, and a gate-overlapped drain structure can be applied. Here, a thin film transistor having an LDD structure in which a low-concentration impurity region 1310 is formed in a part of the semiconductor layer that overlaps the sidewall is shown. Moreover, a multi-gate structure in which transistors to which gate voltage having the same potential equally is applied are serially connected, or a dual gate structure in which gate electrodes sandwich a semiconductor layer on its upper and lower sides can be applied.

The insulating layer 248 is formed with an inorganic insulating material such as silicon oxide or silicon oxynitride, or an organic insulating material such as an acrylic resin or a polyimide resin. In the case of using a coating method such as spin coating or a roll coater, after applying an insulating film material dissolved in an organic solvent, a heat treatment may be performed thereto, thereby forming the insulating layer. For example, after forming a film including a siloxane bond by a coating method, a heat treatment can be conducted at 200 to 400° C., thereby forming the insulating layer. By using an insulating layer formed by a coating method or an insulating layer which has been flattened by reflow as the insulating layer 248, it is possible to prevent wires formed over the layer from breaking. Moreover, the insulating layer can also be used effectively when forming multilayer wiring.

The first conductive layer 243 formed over the insulating layer 248 can be provided so as to intersect with wires to be formed in the same layer as the gate electrode 1304 and has a multilayer wiring structure. The multilayer wiring structure can be obtained by forming wires over a plurality of stacked insulating layers which have a similar function to the insulating layer 248. The first conductive layer 243 is preferably formed with a combination of a low resistant material like aluminum (Al) and barrier metal using a metal material having a high melting point such as titanium (Ti) or molybdenum (Mo), for example a multilayer structure including titanium (Ti) and aluminum (Al), a multilayer structure including molybdenum (Mo) and aluminum (Al), or the like.

Figure 15B:
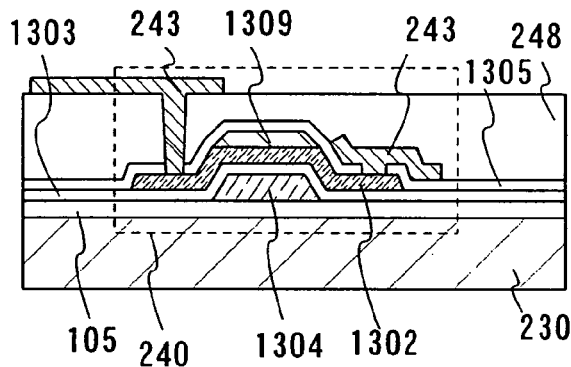

FIG. 15B shows an example of applying a bottom gate thin film transistor as the transistor 240. The insulating layer 105 is formed over the substrate 230, and the thin film transistor is provided thereover. In the thin film transistor, the gate electrode 1304, the insulating layer 1303 functioning as a gate insulating layer, the semiconductor layer 1302, a channel protective layer 1309, the insulating layer 1305 functioning as a protective layer, and the insulating layer 248 functioning as an interlayer insulating layer are provided. Moreover, an insulating layer functioning as a protective layer may be formed thereover. The first conductive layer 243 can be formed over the insulating layer 1305 or the insulating layer 248. In the case of the bottom gate thin film transistor, the insulating layer 1305 is not necessarily formed.

Also, when the substrate 230 is a flexible substrate, the upper temperature limit of the substrate is lower than that of an inflexible substrate such as a glass substrate. Consequently, the thin film transistor is preferably formed using an organic semiconductor.

Figure 15C:
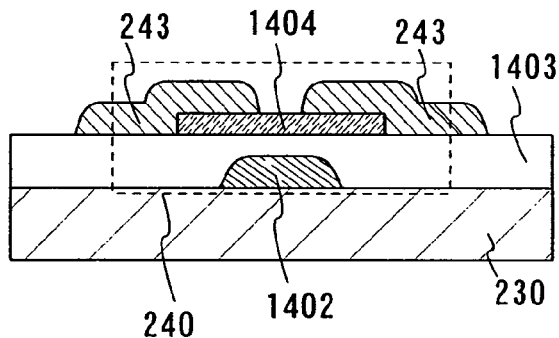

Here, a structure of the thin film transistor using an organic semiconductor as the transistor 240 is described with reference to FIGS. 15C and 15D. FIG. 15C shows an example of applying a staggered organic semiconductor transistor. An organic semiconductor transistor is provided over the substrate 230 as the transistor 240. In the organic semiconductor transistor, a gate electrode 1402, an insulating layer 1403 functioning as a gate insulating film, a semiconductor layer 1404 which overlaps with the gate electrode and the insulating layer 1403 functioning as a gate insulating film, and the first conductive layer 243 connected to the semiconductor layer 1404 are formed. Note that the semiconductor layer 1404 is partially sandwiched by the first conductive layer 243 and the insulating layer 1403 functioning as a gate insulating film.

The gate electrode 1402 can be formed by similar material and method to those of the gate electrode 1304. Also, the gate electrode 1402 can be formed by using a droplet discharging method and then drying and baking. Further, the gate electrode 1402 can be formed by printing a paste including particulates by a printing method over a flexible substrate, and then drying and baking the paste. As a representative example of the particulates, particulates mainly containing any of gold; copper; alloy of gold and silver; alloy of gold and copper; alloy of silver and copper; or alloy of gold, silver, and copper may be used. Furthermore, the particulates may include a conductive oxide such as indium tin oxide (ITO) as its main component.

The insulating layer 1403 functioning as a gate insulating film can be formed by similar material and method to those of the insulating layer 1303. However, in a case of forming the insulating layer by a heat treatment after applying an insulating film material dissolved in an organic solvent, temperature at the heat treatment is to be lower than the upper temperature limit of the flexible substrate.

As a material for the semiconductor layer 1404 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetra-cyanoquinodimethane), PTCDA (a perylene carboxylic acid anhydrous compound), NTCDA (a naphthalene carboxylic acid anhydrous compound), and the like can be given. Further, as another material for the semiconductor layer 1404 of the organic semiconductor transistor, a π-conjugated high molecular compound such as an organic high molecular compound; carbon nanotube; polyvinyl pyridine; a phthalocyanine metal complex; and the like can be given. In particular, a π-conjugated high molecular compound whose skeleton includes a conjugated double bond, such as polyacetylene, polyaniline, polypyrrole, polythienylene, a polythiophene derivative, poly(3alkylthiophene), a polyparaphenylene derivative, or a polyparaphenylenevinylene derivative is preferably used.

As a method for forming the semiconductor layer 1404 of the organic semiconductor transistor, a method for forming a film having a homogeneous thickness over a substrate may be used. The thickness is preferably set to be 1 nm or more and 1,000 nm or less, and more preferably, 10 nm or more and 100 nm or less. As a specific method, an evaporation method, a coating method, a spin coating method, an overcoating method, a solution casting method, a dipping method, a screen printing method, a roll coater method, or a droplet discharging method can be used.

Figure 15D:
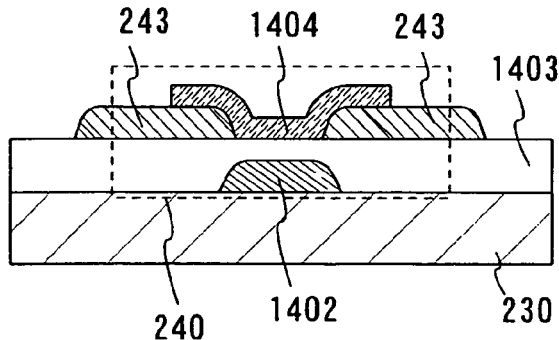

FIG. 15D shows an example of applying a coplanar type organic semiconductor transistor. An organic semiconductor transistor is provided over the substrate 230 as the transistor 240. In the organic semiconductor transistor, the gate electrode 1402, the insulating layer 1403 functioning as a gate insulating film, the first conductive layer 243, and the semiconductor layer 1404 which overlaps with the gate electrode and the insulating layer functioning as a gate insulating layer. Also, the first conductive layer 243 is partially sandwiched by the semiconductor layer and the insulating layer functioning as a gate insulating layer.

Furthermore, the thin film transistor and the organic semiconductor transistor may have any kind of structure as long as they can function as switching elements.

Also, a transistor may be formed using a single crystal substrate or an SOI substrate, and a storage element may be provided thereover. The SOI substrate may be formed by a method of attaching wafers to each other or by a method called SIMOX in which an insulating layer is formed internally by implanting oxygen ions into a Si substrate. As shown in FIG. 7C, the storage element 241 is connected to a field effect transistor 262 provided over a single-crystal semiconductor substrate 260. Moreover, an insulating layer 250 is provided so as to cover a wire 263 of the field effect transistor 262 and the storage element 241 is provided over the insulating layer 250. Also, an insulating layer 261 for separating the field effect transistors 262 is formed.

Since the transistor formed with a single-crystal semiconductor has favorable characteristics such as high response speed and high mobility, the transistor can be operated at high speed. Also, the transistor has little fluctuation in its characteristics; therefore, a semiconductor device with high reliability can be provided. Moreover, since the transistor formed with a single-crystal semiconductor can be processed into small size, high integration as well as downsizing of the semiconductor device are possible.

The storage element 241 has, over the insulating layer 250, a first conductive layer 264 or the first conductive layer 243, the organic compound layer 244, and the second conductive layer 245. Further, the first conductive layers are partially covered with the partition wall (insulating layer) 249. The insulating layer with a thickness of 1 nm or more and 4 nm or less may be formed between the first conductive layer 264 and the organic compound layer 244.

By forming the storage element 241 with the provision of the insulating layer 250 in this way, the first conductive layer 264 can be freely arranged. In other words, in the structures shown in FIGS. 7A and 7B, it has been necessary to provide the storage element 241 in the region other than the wires of the transistor 240; however, by the above structure, for example, it is possible to form the storage element 241 over the transistor 240 provided in a layer 251 having a transistor. This makes it possible to achieve higher integration of the storage circuit 216.

Figure 7C:
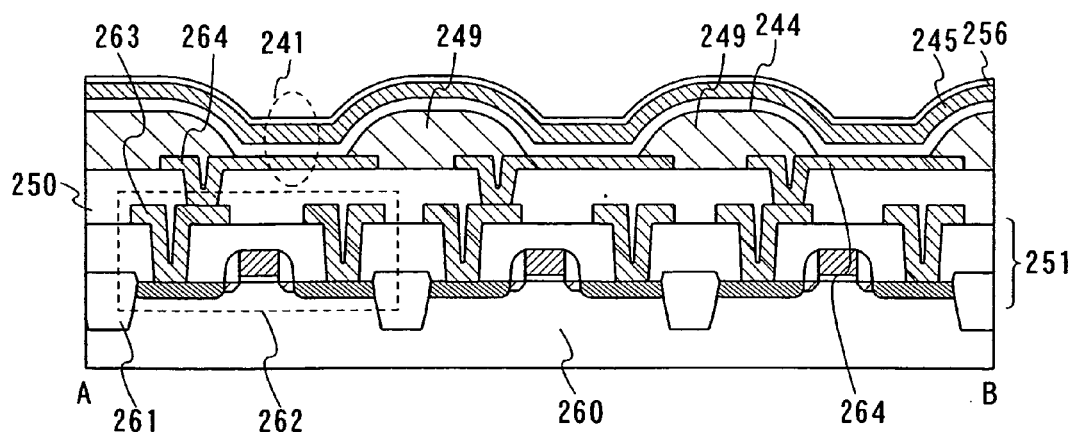

Although FIGS. 7B and 7C show the example in which the organic compound layer 244 is provided over the whole surface of the substrate, the organic compound layer 244 may be selectively provided only in each memory cell. In this case, the utilization efficiency of the material can be improved by providing the organic compound layer selectively in such a way that an organic compound is discharged by a droplet discharging method or the like and baked.

The materials and formation methods of the first conductive layers 243 and 264 and the second conductive layer 245 can be similar to those shown in Embodiment Mode 1.

The organic compound layer 244 can be provided by using similar material and formation method to those of the organic compound layer 29 shown in Embodiment Mode 1.

An element having a rectifying property may be provided between the first conductive layers 243 and 264, and the organic compound layer 244. The element having a rectifying property is a transistor in which a gate electrode and a drain electrode are connected to each other, or a diode. Note that the element having a rectifying property may be provided between the organic compound layer 244 and the second conductive layer 245.

Figure 10:
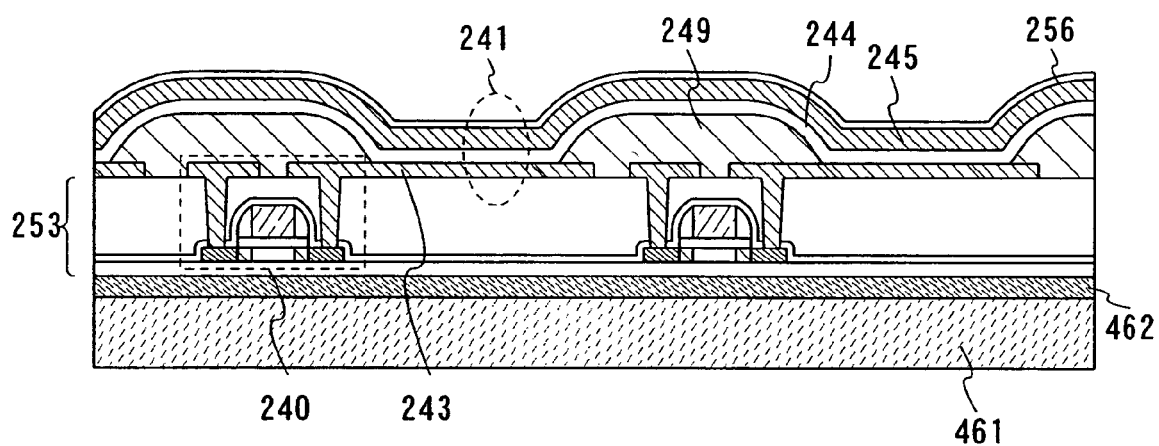
FIG. 10 is a cross-sectional view for describing a semiconductor device of the present invention.

Also, after providing a peeling layer over the substrate 230 and providing the storage element 241 and a layer 253 having a transistor over the peeling layer, the storage element 241 and the layer 253 having a transistor may be peeled from the peeling layer, and then the storage element 241 and the layer 253 having a transistor may be attached onto a substrate 461 with an adhesive layer 462 (see FIG. 10). As a peeling method, the following methods or the like may be used: (1) a peeling method by providing a metal oxide layer as the peeling layer between the substrate 230 having high heat resistance and the layer 253 having a transistor, weakening the metal oxide layer by crystallization, and then peeling the layer 253 having a transistor by a physical means; (2) a peeling method by providing an amorphous silicon film including hydrogen as the peeling layer between the substrate 230 having high heat resistance and the layer 253 having a transistor, and then peeling the substrate having high heat resistance by releasing hydrogen gas from the amorphous silicon film through laser light irradiation, or peeling the layer 253 having a transistor by providing an amorphous silicon film as the peeling layer and removing the amorphous silicon film; (3) a method by mechanically removing the substrate 230 having high heat resistance where the layer 253 having a transistor is formed, or etching the substrate 230 away with the use of a solution or a halogen fluoride gas such as $NF_3$, $BrF_3$, or $ClF_3$; or (4) a peeling method by providing a metal layer and a metal oxide layer as peeling layers between the substrate 230 having high heat resistance and the layer 253 having a transistor, and then weakening the metal oxide layer by crystallization and etching away a portion of the metal layer with the use of a solution or a halogen fluoride gas such as $NF_3$, $BrF_3$, or $ClF_3$, to physically peel the weakened metal oxide layer.

By using the flexible substrate shown as the substrate 30 in Embodiment Mode 1, a film having a thermoplastic resin, paper made of a fibrous material, or the like as the substrate 461, reduction in size, thickness, and weight of a semiconductor device is possible.

Figure 6B:
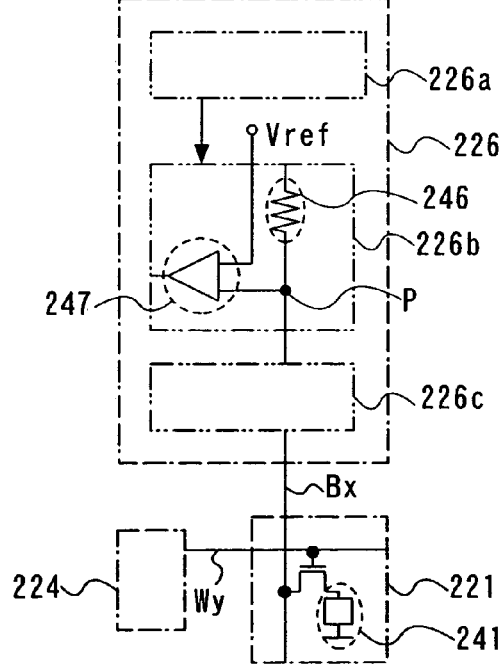

Subsequently, operation for writing data in the storage circuit 216 is described (see FIGS. 6A to 6C).

First, operation for writing data by applying voltage is described. Here, a case of writing data in the memory cell 221 located in column m, row n is described. In this case, a predetermined voltage of V22 is applied to a word line Wn connected to the memory cell 221 by the row decoder 224a. Moreover, a bit line Bm connected to the memory cell 221 is connected to the reading/writing circuit 226b by the column decoder 226a and the selector 226c, and a writing voltage of V21 is outputted to the bit line Bm. The bit line Bm in column m and the word line Wn in row n are selected to turn on the transistor 240 included in the memory cell 221 in column m, row n. Subsequently, the bit line is electrically connected to the storage element 241 and a voltage of approximately Vw=Vcom−V21 is applied. It is to be noted that one electrode of the storage element 241 is connected to a common electrode of a potential Vcom. By appropriately selecting the voltage Vw, the organic compound layer 29 provided between the conductive layers is changed physically or electrically, thereby writing data "1". Specifically, at reading operation voltage, the organic compound layer 29 may be changed so that the electrical resistance between the first conductive layer and the second conductive layer in a state of having the data "1" becomes much smaller than that in a state of having the data "0", or the first conductive layer and the second conductive layer may be simply shorted. The potential may be selected appropriately from the range (V21, V22, Vcom)=(5 to 15 V, 5 to 15 V, 0 V) or (−12 to 0 V, −12 to 0 V, 3 to 5 V). The voltage Vw may be selected from the range of 5 to 15 V or −5 to −15 V.

The voltage is controlled so that the data "1" is not written in the memory cells connected to non-selected word lines and non-selected bit lines. Specifically, potential for turning off transistors in the memory cells connected to the non-selected word lines (for example, 0 V) may be applied so that the non-selected bit lines are set in a floating state, or potential of a similar degree to Vcom may be applied.

For example, the bit line Bm in column m is connected to the first conductive layer 243 in the selected storage element 241, thereby generating potential difference between the first conductive layer 243 and the second conductive layer 245 (see FIG. 7B). Then, the first conductive layer 243 and the second conductive layer 245 are shorted to change the electrical resistance of the storage element.

Meanwhile, in the case of writing the data "0" in the memory cell 221, the electric action is not applied to the memory cell 221. At circuit operation, for example, the memory cell 221 is selected by the row decoder 224a, the column decoder 226a, and the selector 226c, similarly to the case of writing the data "1", but the output potential from the reading/writing circuit 226b to the bit line Bm is set to be similar to Vcom or the bit line Bm is set in a floating state. Accordingly, a small amount of voltage (for example −5 to 5 V) is applied or not applied to the storage element 241, whereby the electrical characteristics do not change and the writing of the data "0" is achieved.

Figure 6C:
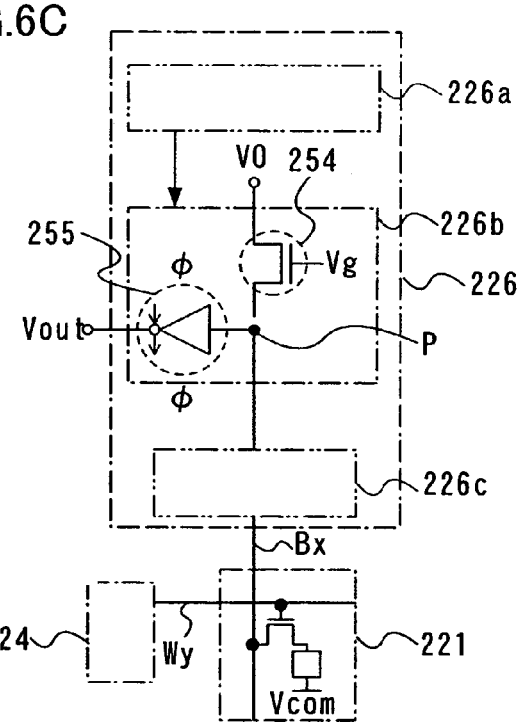

Next, operation for reading data by applying voltage is described (see FIGS. 6A to 6C and FIGS. 7A to 7C). The data reading is carried out by using the difference in the electrical characteristics of the storage element 241 between the memory cell having the data "0" and the memory cell having the data "1". For example, a method of reading by using the difference in the electrical resistance will be described assuming that the electrical resistance of the storage element that forms the memory cell having the data "0" is R0 at the reading voltage and that of the storage element that forms the memory cell having the data "1" is R1 at the reading voltage. It is to be noted that R1<<R0. Here, the reading/writing circuit 226b includes a resistor element 246 and a sense amplifier 247 as a structure of a reading portion. The resistor element has a resistance value Rr, and R1<Rr<R0. The resistor element 246 may be replaced by a transistor 254, and the sense amplifier may be replaced by a clocked inverter 255 (FIG. 6C). The circuit structure is not limited to that shown in FIG. 6C.

The data reading is carried out by applying voltage between the first conductive layer 243 and the second conductive layer 245 and reading the electrical resistance of the organic compound layer 244. For example, in the case of reading data in the memory cell 221 in column m, row n, from the plurality of memory cells 221 in the memory cell array 222, first, a bit line Bm in column m and a word line Wn in row n are selected by the row decoder 224a, the column decoder 226a, and the selector 226c. Specifically, a predetermined voltage of V24 is applied to the word line Wy connected to the memory cell 221 by the row decoder 224a, whereby the transistor 240 is turned on. Moreover, a bit line Bx connected to the memory cell 221 is connected to a terminal P of the reading/writing circuit 226b by the column decoder 226a and the selector 226c. Accordingly, the terminal P has a potential Vp, which is obtained by the Vcom and the V0. Vcom and V0 are determined by resistance division by the resistor element 246 (resistance value Rr) and the storage element 241 (resistance value R0 or R1). Therefore, if the memory cell 221 has the data "0", Vp0=Vcom+(V0−Vcom)×R0/(R0+Rr). If the memory cell 221 has the data "1", Vp1=Vcom+(V0−Vcom)× R1/(R1+Rr). As a result, by selecting Vref so as to be between Vp0 and Vp1 in FIG. 6B and selecting a point of change of the clocked inverter so as to be between Vp0 and Vp1, Lo/Hi (or Hi/Lo) is outputted as the output potential Vout in accordance with the data "0"/"1" and the reading can be carried out.

For example, the sense amplifier is operated at Vdd=3 V, and Vcom is set to be 0 V, V0 is set to be 3 V, and Vref is set to be 1.5 V. If R0/Rr=Rr/R1=9 and the on resistance of the transistor 240 can be ignored, Vp0=2.7 V and Hi is outputted as Vout when the memory cell has the data "0" while Vp1=0.3 V and Lo is outputted as Vout when the memory cell has the data "1". Thus, the reading from the memory cell can be carried out.

Next, operation for reading data in the storage element by applying voltage in the case of using a transistor as the resistor element will be described giving a specific example in FIG. 11.

Figure 11:
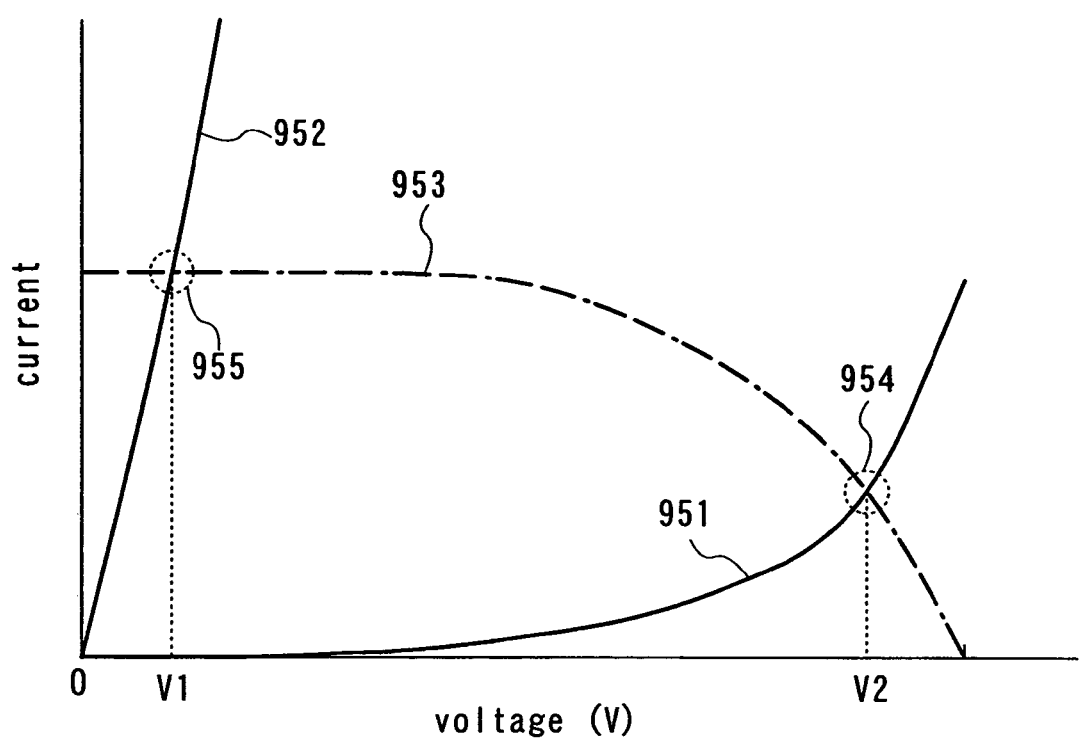
FIG. 11 is a view for describing a current-voltage characteristic of a storage element and a resistor element.

FIG. 11 shows a current-voltage characteristic 951 of a storage element having the data "0", a current-voltage characteristic 952 of a storage element having the data "1", and a current-voltage characteristic 953 of the resistor element 246. Here, a transistor is used as the resistor element 246.

In FIG. 11, in the memory cell having a storage element in which the writing is not carried out, i.e., a storage element having the data "0", an intersection 954 of the current-voltage characteristic 951 of the storage element and the current-voltage characteristic 953 of the transistor serves as an operation point, and the potential of a node P at this time is V2 (V). The potential of the node P is supplied to the sense amplifier 247, in which the data stored in the memory cell is judged as "0".

On the other hand, in the memory cell with the storage element having the data "1", an intersection 955 of the current-voltage characteristic 952 of the storage element and the current-voltage characteristic 953 of the transistor serves as an operation point, and the potential of the node P at this time is V1 (V) (V1<V2). The potential of the node P is supplied to the sense amplifier 247, in which the data stored in the memory cell is judged as "1".

In this way, by reading the resistance-divided potential in accordance with the resistance value of the storage element 241, the data stored in the memory cell can be judged.

According to the above method, the data reading is carried out by a voltage value using the difference in the resistance value of the storage element 241 and the resistance division. However, the information in the storage element 241 may be read by a current value.

This embodiment mode can be freely combined with the above embodiment mode.

By applying the present invention, it is possible to write (additionally record) data at a time other than during manufacturing a chip but impossible to rewrite the data. Thus, a semiconductor device capable of preventing forgery due to rewriting can be provided. Moreover, since the semiconductor device of the present invention has a storage element having a simple structure in which an organic compound layer is sandwiched between a pair of conductive layers, the semiconductor device can be inexpensive. Furthermore, since data are written in the semiconductor device of the present invention by using an electric field generated in the storage element, it is possible to decrease a current value at the writing. By decreasing the area of the storage element, it is possible to decrease the amount of current flowing in the storage element at the writing. In addition, by decreasing the distance between the conductive layers in the storage element, the writing voltage can be decreased. Therefore, the characteristic of the storage element can be improved. Accordingly, the power consumption of the semiconductor device can be reduced.

Embodiment Mode 3

Embodiment Mode 3 will describe an example of a semiconductor device capable of reading and writing data without contact, with reference to the drawings.

In the semiconductor device that is described in this embodiment mode, reading and writing data are possible without contact. Transmission formats of data are roughly classified into three types, which are: electromagnetic coupling type which carries out communication through mutual induction by positioning a pair of coils so as to face each other; electromagnetic induction type which carries out communication through an induction field; and electric wave type which carries out communication by utilizing electric waves. Any type may be used. Moreover, an antenna used for the data transmission is provided in two ways: one is that the antenna is provided over a substrate where a transistor and a storage element are provided, and the other is that a terminal portion is provided over a substrate where a transistor and a storage element are provided and an antenna provided to another substrate is connected to the terminal portion.

One structural example of a semiconductor device in which an antenna is provided over a substrate where a plurality of elements and storage elements are provided is described with reference to FIGS. 8A and 8B.

Figure 8A:
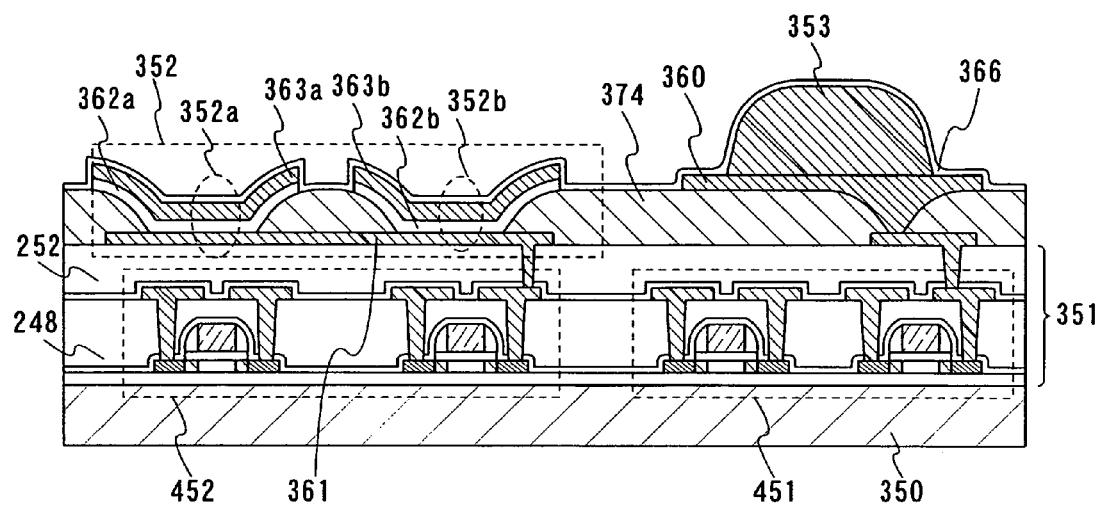
FIGS. 8A and 8B are cross-sectional views for describing a semiconductor device of the present invention.

FIG. 8A shows a semiconductor device including a storage circuit that is formed as a passive matrix type. The semiconductor device has a layer 351 having transistors 451 and 452 that is formed over a substrate 350; a storage element portion 352 formed over the layer 351 having the transistors; and a conductive layer 353 functioning as an antenna.

Although here the case is shown where the storage element portion 352 and the conductive layer 353 functioning as an antenna are formed over the layer 351 having the transistors, the structure is not limited to this, and the storage element portion 352 or the conductive layer 353 functioning as an antenna may be provided below or in the same layer as the layer 351 having the transistors.

The storage element portion 352 includes a plurality of storage elements 352a and 352b. The storage element 352a includes a first conductive layer 361 formed over an insulating layer 252; an organic compound layer 362a covering the first conductive layer 361, and a partition wall (insulating layer) 374; and a second conductive layer 363a. The first conductive layer is partially covered with the partition wall (insulating layer) 374. Further, an insulating layer having a thickness of 1 nm or more and 4 nm or less may be formed between the first conductive layer 361 and the organic compound layer 362a.

Further, the storage element 352b includes the first conductive layer 361 formed over the insulating layer 252, an organic compound layer 362b covering the first conductive layer 361 and the partition wall (insulating layer) 374, and a second conductive layer 363b. A part of the first conductive layer is covered with the partition wall (insulating layer) 374.

An insulating layer 366 functioning as a protective film is formed covering the second conductive layers 363a and 363b and the conductive layer 353 functioning as an antenna. Moreover, the first conductive layer 361 that forms the storage element portion 352 is connected to a wire of the transistor 452. The storage element portion 352 can be formed by a similar material or manufacturing method to that of the storage element shown in the above embodiment mode.

In the storage element portion 352, as shown in the aforementioned embodiment mode, an element having a rectifying property may be provided between the first conductive layer 361 and the organic compound layers 362a and 362b, or between the organic compound layers 362a and 362b and the second conductive layers 363a and 363b. For the element having a rectifying property, the one mentioned above in Embodiment Mode 1 can be used.

Here, the conductive layer 353 functioning as an antenna is provided over the conductive layer 360 formed in the same layer as the second conductive layers 363a and 363b. The conductive layer 360 can also function as an antenna. The conductive layer functioning as an antenna may be formed in the same layer as the second conductive layers 363a and 363b. The conductive layer 353 functioning as an antenna is connected to a source wire or a drain wire of the transistor 451.

The conductive layer 353 functioning as an antenna may have a shape of a square coil, circular coil, square loop, circular loop, linear dipole, curved dipole, or the like.

The conductive layer 353 functioning as an antenna can be formed with one kind of element selected from gold, (Au), platinum (Pt), nickel (Ni), tungsten (W), molybdenum (Mo), cobalt (Co), copper (Cu), aluminum (Al), manganese (Mn), titanium (Ti), and the like; alloy including a plurality of the elements; or the like. Also, as a formation method of the conductive layer 353 functioning as an antenna, evaporation, sputtering, a CVD method, various printing methods such as screen printing and gravure printing, a droplet discharging method, or the like can be used.

As the transistors 451 and 452 included in the layer 351 having the transistors, the transistors 240 and 262 shown in Embodiment Mode 2 can be appropriately used.

After a peeling layer, the layer 351 having the transistors, the storage element portion 352, and the conductive layer 353 functioning as an antenna are formed over a substrate, the layer 351 having the transistors, the storage element portion 352, and the conductive layer 353 functioning as an antenna may be peeled by appropriately using the peeling method shown in Embodiment Mode 2 and pasted onto a substrate with an adhesive layer. As the latter substrate, the flexible substrate shown by the substrate 30 in Embodiment Mode 1, a film having a thermoplastic resin layer, paper made of a fibrous material, a base material film, or the like is used, whereby reduction in size, thickness, and weight of the semiconductor device can be achieved.

Figure 8B:
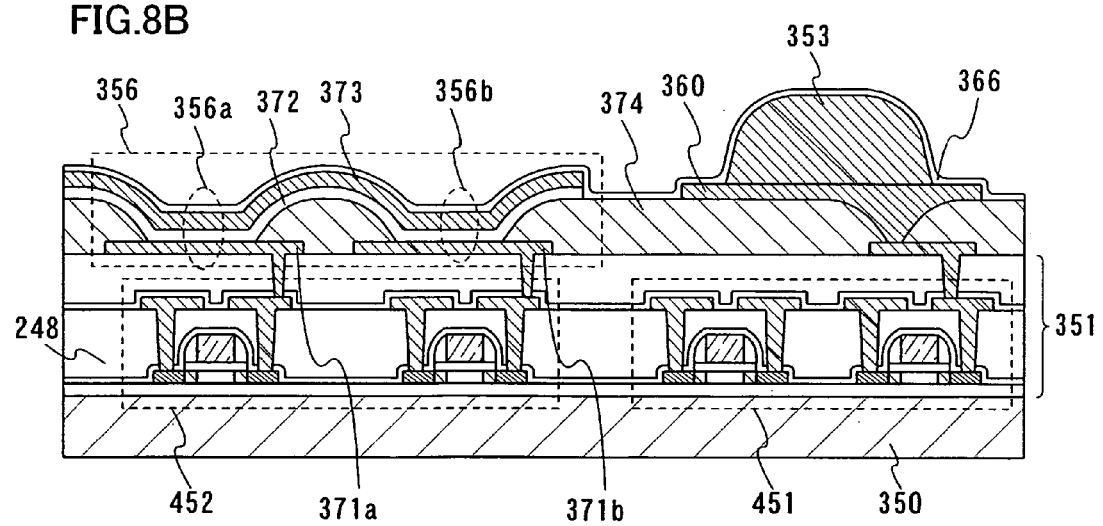

FIG. 8B shows an example of a semiconductor device having an active matrix storage circuit. With reference to FIG. 8B, portions different from those in FIG. 8A are described.

The semiconductor device shown in FIG. 8B has the layer 351 having the transistors 451 and 452 over the substrate 350, and the storage element portion 356 and the conductive layer 353 functioning as an antenna over the layer 351 having the transistors. Although here the case is shown where the semiconductor device has the transistor 452 functioning as a switching element of the storage element portion 356 in the same layer as the transistor 451 and has the conductive layer 353 functioning as an antenna and the storage element portion 356 over the layer 351 having the transistors, the structure is not limited to this, and the transistor 452 may be formed over or below the layer 351 having the transistors, or the storage element portion 356 and the conductive layer 353 functioning as an antenna may be provided below or in the same layer as the layer 351 having the transistors.

The storage element portion 356 is formed by using storage elements 356a and 356b. The storage element 356a has a first conductive layer 371a formed over the insulating layer 252, an organic compound layer 372 covering and the partition wall (insulating layer) 374, and a second conductive layer 373. A part of the first conductive layer 371a is covered with the partition wall (insulating layer) 374.

The storage element 356b has a first conductive layer 371b formed over the insulating layer 252, the organic compound layer 372 covering the partition wall (insulating layer) 374, and the second conductive layer 373. A part of the first conductive layer 371b is covered with the partition wall (insulating layer) 374.

Here, the first conductive layers 371a and 371b are connected to the respective wires of the transistors. In other words, each storage element is connected to a switching transistor.

Further, the storage elements 356a and 356b can be formed by appropriately using the material and manufacturing method described in Embodiment Modes 1 and 2. Also, in the storage elements 356a and 356b, as mentioned above, an element having a rectifying property may be provided between the first conductive layers 371a and 371b, and the organic compound layer 372, or between the organic compound layer 372 and the second conductive layer 373.

The layer 351 having the transistors, the storage element portion 356, and the conductive layer 353 functioning as an antenna can be formed by evaporation, a sputtering method, a CVD method, a printing method, a droplet discharging method, or the like. Different methods may be employed depending on location.

Also, after a peeling layer, the layer 351 having the transistors, the storage element portion 356, and the conductive layer 353 functioning as an antenna are formed over the substrate, the layer 351 having the transistors, the storage element portion 356, and the conductive layer 353 functioning as an antenna may be peeled and pasted to a substrate by using an adhesive layer.

Note that a sensor that connects to a transistor may be provided. As the sensor, an element which detects temperature, humidity, illuminance, gas, gravity, pressure, sound (vibration), acceleration, or other characteristics by a physical or chemical means is given. The sensor is typically formed by a semiconductor element such as a resistor element, a capacitively coupled element, an inductively coupled element, a photovoltaic element, a photoelectric conversion element, a thermo-electromotive force element, a transistor, a thermistor, a diode, a capacitance type element, or a piezo element.

Next, a structural example of a semiconductor device which includes a layer having a transistor, a terminal portion connected to a transistor, a first substrate having a storage element, and a second substrate where an antenna to be connected to the terminal portion is formed is described with reference to FIGS. 9A and 9B. Description is made on parts different from those in FIGS. 8A and 8B.

Figure 9A:
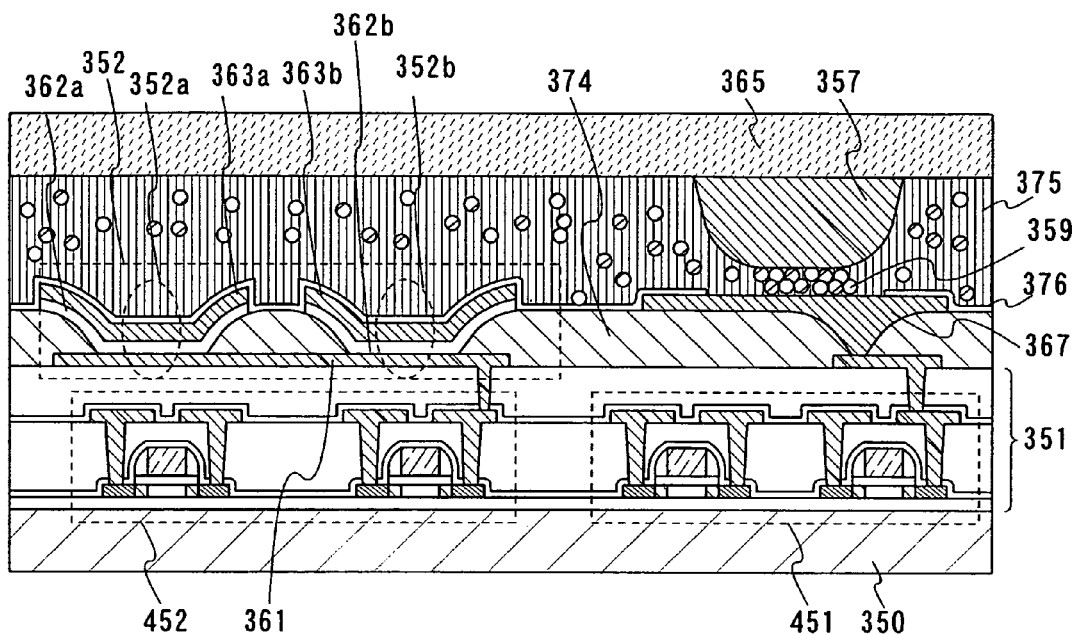
FIGS. 9A and 9B are cross-sectional views for describing a semiconductor device of the present invention.

FIG. 9A shows a passive matrix semiconductor device. The semiconductor device includes the layer 351 having the transistors formed over the substrate 350, the storage element portion 352 formed over the layer 351 having the transistors, a connection terminal 367 connected to a transistor, and a substrate 365 where a conductive layer 357 functioning as an antenna is formed. The conductive layer 357 and the connection terminal 367 are connected by a conductive particle. A protective film 376 which exposes a part of the connection terminal 367. Here, although a case of providing the storage element portion 352 over the layer 351 having the transistors is shown, the structure is not limited to this, and the storage element portion 356 may be provided below or in the same layer as the layer 351 having the transistors.

The storage element portion 352 may have the same structure as the storage element portion 352 shown in FIG. 8A.

The substrate that includes the layer 351 having the transistors and the storage element portion 352 is pasted to the substrate 365 where the conductive layer 357 functioning as an antenna is provided, with the use of a resin 375 having adhesiveness. Then, the connection terminal 367 connected to the transistor and the conductive layer 357 are electrically connected through a conductive particle 359 contained in the resin 375. Moreover, the substrate that includes the layer 351 having the transistors and the storage element portion 352 may be pasted to the substrate 365 where the conductive layer 357 functioning as an antenna is provided, with the use of a conductive adhesive such as gold paste, silver paste, copper paste, or carbon paste, or by a method using solder bonding.

Figure 9B:
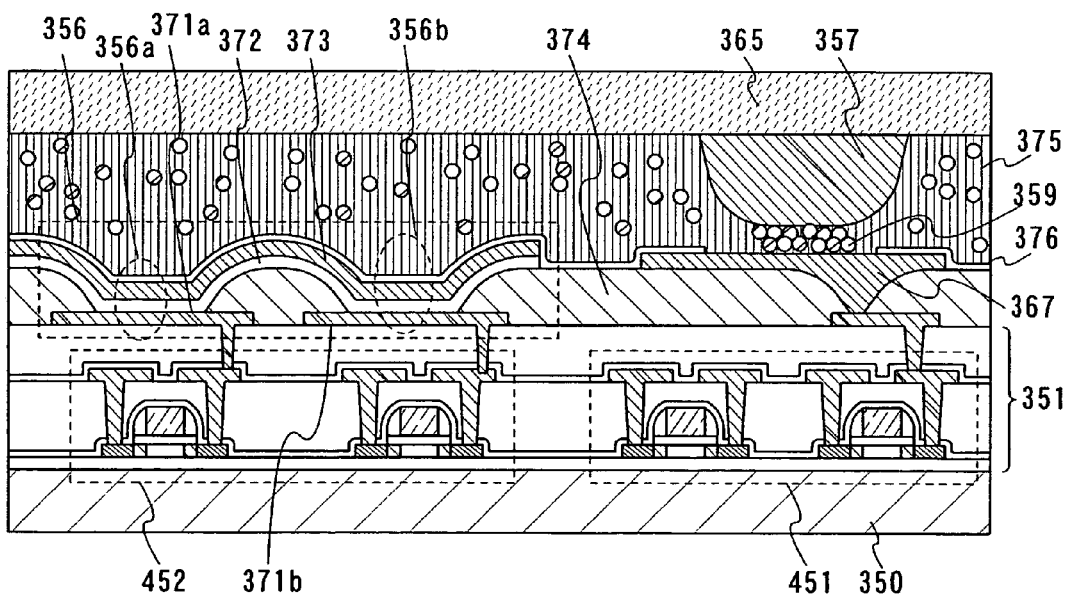

FIG. 9B shows one structure of the semiconductor device shown in Embodiment Mode 2, which has the layer 351 having the transistors 451 and 452 formed over the substrate 350, the storage element portion 356 formed over the layer 351 having the transistors, the connection terminal 367 connected to a transistor, and the substrate 365 where the conductive layer 357 functioning as an antenna is formed, wherein the conductive layer 357 and the connection terminal are connected by a conductive particle. Although the transistor 452 is formed in the same layer as the transistor 451 in the layer 351 having the transistors and the conductive layer 357 functioning as an antenna is provided over the layer 351 having the transistors, the structure is not limited to this, and the storage element portion 356 may be formed below or in the same layer as the layer 351 having the transistors.

The storage element portion 356 can be formed by using the storage elements 356a and 356b having the structure shown in FIG. 8B.

Even in FIG. 9B, the substrate that includes the layer 351 having the transistors and the storage element portion 356 is pasted to the substrate 365 where the conductive layer 357 functioning as an antenna is provided, with the use of the resin 375 containing the conductive particle 359. Moreover, the conductive layer 357 and the connection terminal 367 are connected to each other by the conductive particle 359.

Alternatively, the peeling layer, the layer 351 having the transistors, and the storage element portion 356 may be formed over the substrate; the layer 351 having the transistors and the storage element portion 356 may be peeled by appropriately using the peeling method shown in Embodiment Mode 2; and then the peeled layer 351 having the transistors and storage element portion 356 may be pasted onto a substrate by using an adhesive layer.

Moreover, the storage element portions 352 and 356 may be provided over the substrate 365 where the conductive layer 357 functioning as an antenna is provided. That is, the first substrate where the layer 351 having the transistors is formed may be pasted to the second substrate 365 where the storage element portions 352 and 356 and the conductive layer 357 functioning as an antenna are formed, by a resin containing a conductive particle. Moreover, similarly to the semiconductor devices shown in FIGS. 8A and 8B, a sensor may be provided in connection with a transistor.

This embodiment mode can be freely combined with the above embodiment mode.

By applying the present invention, it is possible to write (additionally record) data at a time other than during manufacturing a chip but impossible to rewrite the data. Thus, a semiconductor device capable of preventing forgery due to rewriting can be provided. Moreover, since the semiconductor device of the present invention has a storage element having a simple structure in which an organic compound layer is sandwiched between a pair of conductive layers, the semiconductor device can be inexpensive. Furthermore, since data are written in the semiconductor device of the present invention by using an electric field generated in the storage element, it is possible to decrease a current value at the writing. By decreasing the area of the storage element, it is possible to decrease the current value flowing in the storage element at the writing. In addition, by decreasing the distance between the conductive layers in the storage element, the writing voltage can be decreased. Therefore, the characteristic of the storage element can be improved. Accordingly, the power consumption of the semiconductor device can be reduced.

Embodiment 1

Figure 12A:
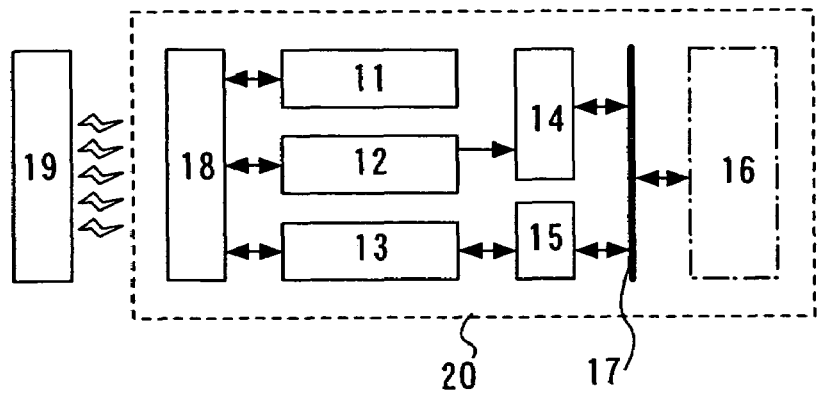
FIGS. 12A to 12C are views for describing structural examples of a semiconductor device of the present invention.

Here, a structure of a semiconductor device of the present invention is described with reference to FIGS. 12A to 12C. As shown in FIG. 12A, a semiconductor device 20 of the present invention has a function to send and receive data without contact, and also has a power source circuit 11, a clock generating circuit 12, a data modulating/demodulating circuit 13, a controlling circuit 14 which controls another circuit, an interface circuit 15, a storage circuit 16, a bus 17, and an antenna 18.

Figure 12B:
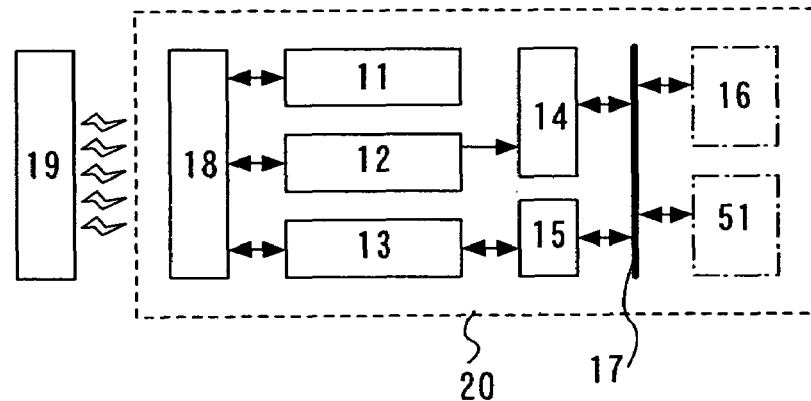

Further, as shown in FIG. 12B, the semiconductor device 20 of the present invention has a function to send and receive data without contact, and may have a central processing unit 51, in addition to the power source circuit 11, the clock generating circuit 12, the data modulating/demodulating circuit 13, the controlling circuit 14 which controls another circuit, the interface circuit 15, the storage circuit 16, the bus 17, and the antenna 18.

Figure 12C:
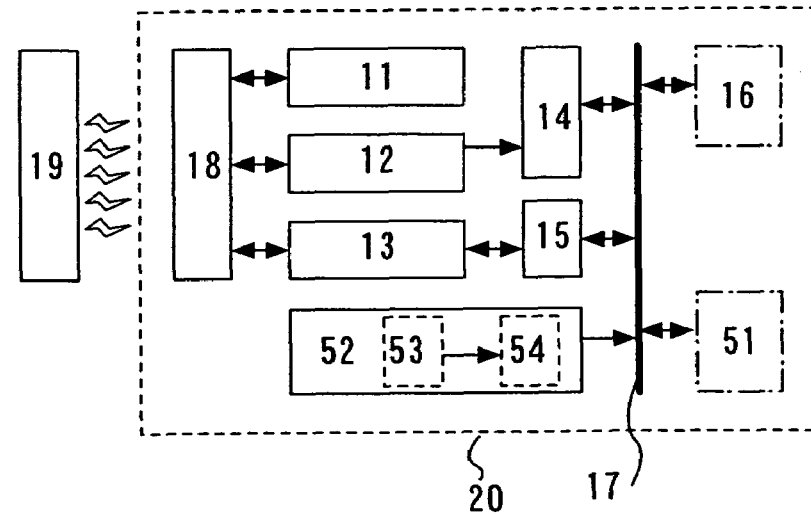

Moreover, as shown in FIG. 12C, the semiconductor device 20 of the present invention has a function to send and receive data without contact, and may have a detection portion 52 including a detection element 53 and a detection controlling circuit 54, in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51.

In the semiconductor device of this embodiment, the detection portion 52 including the detection element 53 and the detection controlling circuit 54 and the like are formed in addition to the power source circuit 11, the clock generating circuit 12, the data modulating/demodulating circuit 13, the controlling circuit 14 which controls another circuit, the interface circuit 15, the storage circuit 16, the bus 17, the antenna 18, and the central processing unit 51, by using transistors in layers having transistors. This structure makes it possible to form a compact semiconductor device capable of sending and receiving an electric wave as well as having a sensing function.

The power source circuit 11 is a circuit generating various power sources to be supplied to the respective circuits in the semiconductor device 20 based on an alternating signal inputted from the antenna 18. The clock generating circuit 12 is a circuit generating various clock signals to be supplied to the respective circuits in the semiconductor device 20 based on an alternating signal inputted from the antenna 18. The data modulating/demodulating circuit 13 has a function to modulate/demodulate data to be sent to or received from a reader/writer 19. The controlling circuit 14 has a function to control the storage circuit 16. The antenna 18 has a function to send and receive an electromagnetic wave or an electric wave. The reader/writer 19 exchanges data with the semiconductor device, controls the semiconductor device, and controls the process of the data sent to or received from the semiconductor device. The semiconductor device is not restricted by the above structure, and for example, another element such as a limiter circuit of power source voltage or hardware only for processing codes may be added.

The storage circuit 16 has one or more of elements selected from the storage elements shown in Embodiment Mode 1 or 2. The storage element having an organic compound layer can achieve downsizing, film thinning, and increasing in capacity at the same time; therefore, when the storage circuit 16 is provided by using the storage element having an organic compound layer, the reduction in size and weight of the semiconductor device can be achieved.

The detection portion 52 can detect temperature, pressure, flow rate, light, magnetism, sound (vibration), acceleration, humidity, illuminance, gas constituent, liquid constituent, and other characteristics by a physical or chemical means. Moreover, the detection portion 52 has the detection element 53 for detecting a physical amount or a chemical amount and the detection controlling circuit 54 for converting the physical amount or the chemical amount detected by the detection element 53 into an appropriate signal such as an electric signal. As the detection element 53, it is possible to use a resistor element, a capacitively coupled element, an inductively coupled element, a photovoltaic element, a photoelectric conversion element, a thermo-electromotive force element, a transistor, a thermistor, a diode, an electrostatic capacitance element, a piezoelectric element, or the like. The number of detection portions 52 may be more than one and, in such a case, it is possible to detect a plurality of physical amounts or chemical amounts simultaneously.

The physical amount described here means temperature, pressure, flow rate, light, magnetism, sound (vibration), acceleration, humidity, and the like, while the chemical amount means a chemical substance such as a gas constituent or a constituent included in a liquid such as an ion, or the like. In addition, an organic compound such as a particular biological substance included in blood, sweat, urine, or the like (for example, blood-sugar level in the blood) is also included. In particular, in the case of detecting the chemical amount, since a particular substance is to be selectively detected by necessity, a substance which selectively reacts with the substance to be detected is provided in advance in the detection element 53. For example, in the case of detecting a biological substance, it is preferable to fix, in a polymer or the like, enzyme, a resistor molecule, a microbial cell, or the like which selectively reacts with the biological substance to be detected by the detection element 53.

Embodiment 2

Figure 14A:
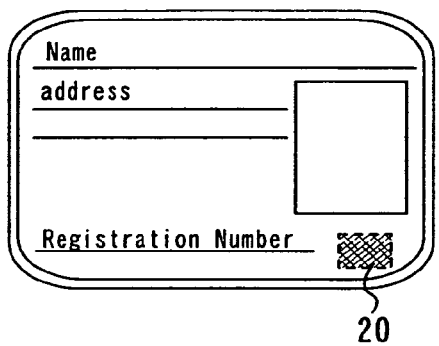
FIGS. 14A to 14F are views for describing usage of a semiconductor device of the present invention.
Figure 14B:
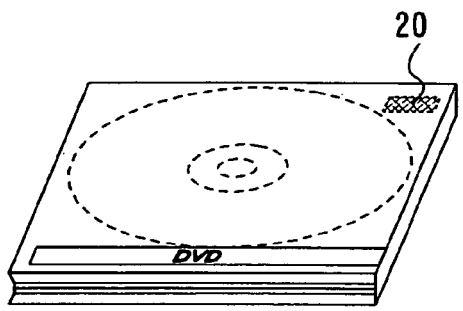
Figure 14C:
Figure 14D:
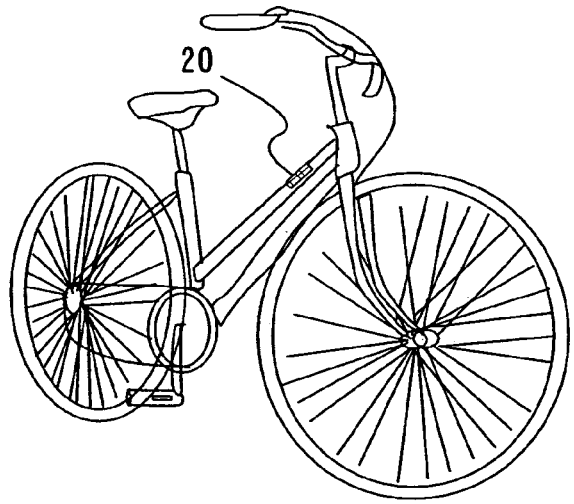
Figure 14E:
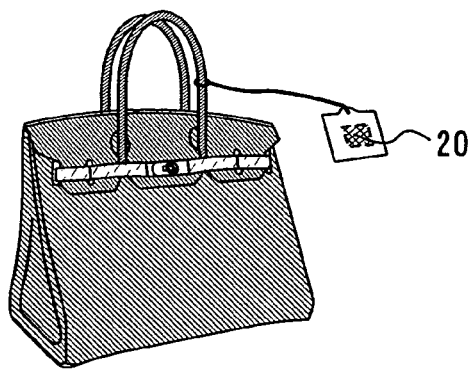
Figure 14F:
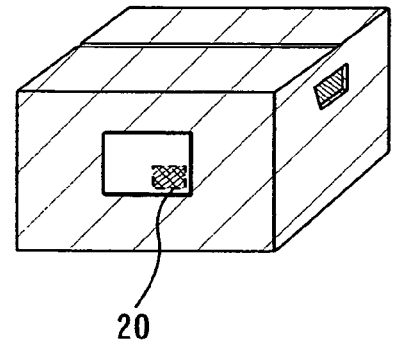

A semiconductor device functioning as a wireless chip can be formed according to the present invention. The wireless chip is applicable in a wide range. For example, the semiconductor device 20 functioning as the wireless chip can be applied to banknotes, coins, documents of value, unregistered bonds, identification certificates (driver's license, certificate of residence, and the like, see FIG. 14A), containers for package (package paper, bottles, and the like, see FIG. 14C), recording media (DVD software, video tapes, and the like, see FIG. 14B), vehicles (bicycles and the like, see FIG. 14D), personal belongings (bags, glasses, and the like), foods, plants, clothes, livingware, electronic appliances, baggage tags (see FIGS. 14E and 14F), and the like. Moreover, the semiconductor device can be provided to animals and human bodies. The electronic appliances include a liquid crystal display device, an EL (Electro Luminescence) display device, a television device (also referred to as simply a TV, a TV receiving machine, or a television receiving machine), a mobile phone, and the like.

The semiconductor device 20 of the present invention is fixed to a product by pasting the semiconductor device 20 to the surface of the product or embedding it inside the product. For example, if the product is a book, the semiconductor device 20 is fixed to the book by embedding it inside a paper, and if the product is a package made of an organic resin, the semiconductor device 20 is fixed to the package by embedding it inside the organic resin. Since the semiconductor device 20 of the present invention can be compact, thin, and lightweight, the design quality of the product itself is not degraded even after the device is fixed to the product. By providing the semiconductor device 20 to banknotes, coins, documents of value, unregistered bonds, identification certificates, and the like, a certification function can be provided and the forgery can be prevented by using the certification function. Moreover, when the semiconductor device of the present invention is provided in containers for package, recording media, personal belongings, foods, clothes, livingware, electronic appliances, and the like, systems such as an inspection system can become more efficient.

Figure 13:
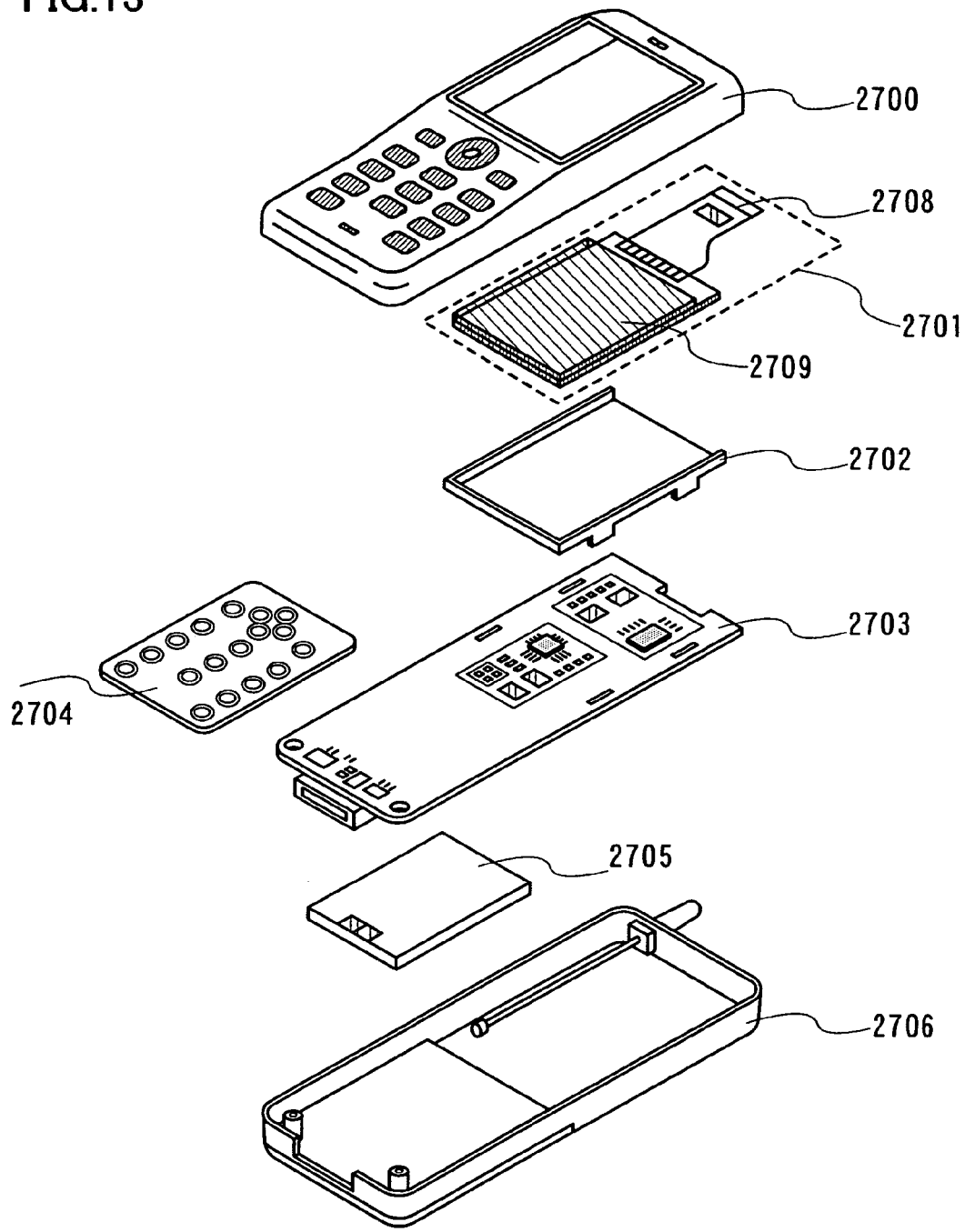
FIG. 13 is a view for describing an electronic appliance having a semiconductor device of the present invention.

Next, a mode of the electronic appliance to which the semiconductor device of the present invention has been mounted will be described with reference to the drawings. The electronic appliance to be exemplified here is a mobile phone, including cases 2700 and 2706, a panel 2701, a housing 2702, a print wiring substrate 2703, operation buttons 2704, a battery 2705, and the like (see FIG. 13). The panel 2701 is detachably incorporated in the housing 2702 and the housing 2702 is fitted into the print wiring substrate 2703. The shape and size of the housing 2702 change appropriately in accordance with the electronic appliance into which the panel 2701 is to be incorporated. On the print wiring substrate 2703, a plurality of packaged semiconductor devices are mounted. The semiconductor device of the present invention can be used as one of the packaged semiconductor devices. The plurality of semiconductor devices to be mounted on the print wiring substrate 2703 have any function selected from a controller, a central processing unit (CPU), a memory, a power source circuit, an audio process circuit, a send/receive circuit, and the like.

The panel 2701 is connected to the print wiring substrate 2703 through a connection film 2708. The above panel 2701, housing 2702, and print wiring substrate 2703 are housed inside the cases 2700 and 2706 together with the operation buttons 2704 and the battery 2705. A pixel region 2709 in the panel 2701 is provided so as to be observed through an opening window provided in the case 2700.

As thus described, the semiconductor device of the present invention is compact, thin, and lightweight. This makes it possible to efficiently use the limited space in the cases 2700 and 2706 of the electronic appliance.

Since the semiconductor device of the present invention has a storage element having a simple structure in which an organic compound layer which changes by applying voltage thereto from outside is sandwiched between a pair of conductive layers, an electronic appliance using an inexpensive semiconductor device can be provided. Moreover, since high integration is easy with the semiconductor device of the present invention, an electronic appliance using the semiconductor device having a storage circuit with large capacity can be provided.

Moreover, data are written in the semiconductor device of the present invention by applying voltage from outside, and the semiconductor device is nonvolatile and additionally recordable. This makes it possible to prevent forgery due to rewriting and to additionally write new data therein. Therefore, an electronic appliance that uses a sophisticated and high-value-added semiconductor device can be provided.

It is to be noted that the shapes of the cases 2700 and 2706 are just an example of an exterior shape of the mobile phone, and the electronic appliance of the present invention can be modified into various modes in accordance with the function and intended purpose.

This application is based on Japanese Patent Application serial no. 2005-148821 filed in Japan Patent Office on May 20, 2005, the entire contents of which are hereby incorporated by reference.

What is claimed is:

1. A semiconductor device comprising:
   a memory cell array in which storage elements are arranged in matrix; and
   a writing circuit,
   wherein each of the storage elements includes a first conductive layer, a second conductive layer, and an organic compound layer between the first conductive layer and the second conductive layer,
   wherein the first conductive layer and the second conductive layer are configured to contact each other in the organic compound layer by Coulomb force, the Coulomb force is generated by applying a potential to one or both of the first conductive layer and the second conductive layer,
   wherein a thickness of the organic compound layer ranges from 5 to 100 nm, and
   wherein the organic compound layer includes a plurality of layers formed with different organic compounds.

2. A semiconductor device according to claim 1, further comprising:
   a conductive layer functioning as an antenna; and
   a transistor connected to the conductive layer.

3. A semiconductor device according to claim 1, further comprising:
   a diode connected to the first conductive layer or the second conductive layer.

4. A semiconductor device according to claim 1, wherein the first conductive layer is formed with a titanium film with a thickness of 50 to 200 nm.

5. A semiconductor device according to claim 1, wherein the second conductive layer is formed with an aluminum film with a thickness of 50 to 200 nm.

6. A semiconductor device comprising:
   a memory cell array in which storage elements are arranged in matrix; and
   a writing circuit,
   wherein each of the storage elements includes a first conductive layer, a second conductive layer, and an organic compound layer between the first conductive layer and the second conductive layer, and
   wherein the first conductive layer and the second conductive layer are configured to contact each other in the organic compound layer by Coulomb force, the Coulomb force is generated by applying a potential to one or both of the first conductive layer and the second conductive layer.

7. A semiconductor device according to claim 6, further comprising:
   a conductive layer functioning as an antenna; and
   a transistor connected to the conductive layer.

8. A semiconductor device according to claim 6, further comprising:
a diode connected to the first conductive layer or the second conductive layer.

9. A semiconductor device according to claim 6, wherein the organic compound layer includes a plurality of layers formed with different organic compounds.

10. A semiconductor device according to claim 6, wherein the first conductive layer is formed with a titanium film with a thickness of 50 to 200 nm.

11. A semiconductor device according to claim 6, wherein the second conductive layer is formed with an aluminum film with a thickness of 50 to 200 nm.

12. A semiconductor device according to claim 6, wherein a thickness of the organic compound layer ranges from 5 to 100 nm.

13. A semiconductor device according to claim 6, wherein the memory cell array and the writing circuit are provided over a glass substrate or a flexible substrate.

14. A semiconductor device according to claim 13, wherein the writing circuit is formed by using a transistor.

15. A semiconductor device according to claim 6, wherein the memory cell array and the writing circuit are provided over a single- crystal semiconductor substrate.

16. A semiconductor device according to claim 15, wherein the writing circuit is formed by using a field effect transistor.

17. A semiconductor device comprising:
a memory cell array in which memory cells are arranged in matrix; and
a writing circuit,
wherein each of the memory cells includes a transistor and a storage element,
wherein the storage element includes a first conductive layer, a second conductive layer, and an organic compound layer between the first conductive layer and the second conductive layer, and
wherein the first conductive layer and the second conductive layer are configured to contact each other in the organic compound layer by Coulomb force, the Coulomb force is generated by applying a potential to one or both of the first conductive layer and the second conductive layer.

18. A semiconductor device according to claim 17, further comprising:
a conductive layer functioning as an antenna; and
a transistor connected to the conductive layer.

19. A semiconductor device according to claim 17, further comprising:
a diode connected to the first conductive layer or the second conductive layer.

20. A semiconductor device according to claim 17, wherein the organic compound layer includes a plurality of layers formed with different organic compounds.

21. A semiconductor device according to claim 17, wherein the first conductive layer is formed with a titanium film with a thickness of 50 to 200 nm.

22. A semiconductor device according to claim 17, wherein the second conductive layer is formed with an aluminum film with a thickness of 50 to 200 nm.

23. A semiconductor device according to claim 17, wherein a thickness of the organic compound layer ranges from 5 to 100 nm.

24. A semiconductor device according to claim 17, wherein the memory cell array and the writing circuit are provided over a glass substrate or a flexible substrate.

25. A semiconductor device according to claim 24, wherein the writing circuit is formed by using a transistor.

26. A semiconductor device according to claim 17, wherein the memory cell array and the writing circuit are provided over a single-crystal semiconductor substrate.

27. A semiconductor device according to claim 26, wherein the writing circuit is formed by using a field effect transistor.

28. A semiconductor device comprising:
a memory cell array in which memory cells are arranged in matrix; and
a writing circuit,
wherein each of the memory cells includes a transistor and a storage element,
wherein the storage element includes a first conductive layer, a second conductive layer, and an organic compound layer between the first conductive layer and the second conductive layer,
wherein the first conductive layer and the second conductive layer are configured to contact each other in the organic compound layer by Coulomb force, the Coulomb force is generated by applying a potential to one or both of the first conductive layer and the second conductive layer,
wherein a thickness of the organic compound layer ranges from 5 to 100 nm, and
wherein the organic compound layer includes a plurality of layers formed with different organic compounds.

29. A semiconductor device according to claim 28, wherein the first conductive layer is formed with a titanium film with a thickness of 50 to 200 nm.

30. A semiconductor device according to claim 28, wherein the second conductive layer is formed with an aluminum film with a thickness of 50 to 200 nm.

* * * * *